(12) United States Patent
Wang et al.

(10) Patent No.: US 11,764,203 B2
(45) Date of Patent: *Sep. 19, 2023

(54) INTEGRATED HYBRID STANDARD CELL STRUCTURE WITH GATE-ALL-AROUND DEVICE

(71) Applicant: Taiwan Semiconductor Manufacturing Co., Ltd., Hsin-Chu (TW)

(72) Inventors: Chih-Hao Wang, Hsinchu County (TW); Shang-Wen Chang, Hsinchu County (TW); Min Cao, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 115 days.

This patent is subject to a terminal disclaimer.

(21) Appl. No.: 17/385,119

(22) Filed: Jul. 26, 2021

(65) Prior Publication Data
US 2021/0351175 A1 Nov. 11, 2021

Related U.S. Application Data

(63) Continuation of application No. 16/727,731, filed on Dec. 26, 2019, now Pat. No. 11,075,195.

(51) Int. Cl.
*H01L 27/02* (2006.01)
*H01L 29/06* (2006.01)
(Continued)

(52) U.S. Cl.
CPC .... *H01L 27/0207* (2013.01); *H01L 21/02532* (2013.01); *H01L 21/02603* (2013.01);
(Continued)

(58) Field of Classification Search
CPC .......... H01L 27/0207; H01L 21/02532; H01L 21/02603; H01L 21/823807;
(Continued)

(56) References Cited

U.S. PATENT DOCUMENTS 8,796,666 B1 8/2014 Huang et al.
8,815,712 B2 8/2014 Wan et al.
(Continued)

*Primary Examiner* — Tong-Ho Kim
(74) *Attorney, Agent, or Firm* — HAYNES AND BOONE, LLP

(57) ABSTRACT

The disclosed circuit includes a first and a second active region (AR) spaced a spacing S along a direction in a first standard cell (SC) that spans $D_l$ along the direction between a first and a second cell edge (CE). Each of the first and second ARs spans a first width $W_1$ along the direction; a third and a fourth AR spaced S in a second SC that spans a second dimension $D_s$ along the direction between a third and a fourth CE; and gate stacks extend from the fourth CE of the second SC to the first CE of the first SC, wherein $D_s < D_l$; each of the third and fourth ARs spans a second width $W_2$ along the direction; $W_2 < W_1$; and the third CE is aligned with and contacts the second CE. The first and second ARs have a structure different from the third and fourth ARs.

20 Claims, 17 Drawing Sheets

(51) Int. Cl.
    *H01L 29/423*    (2006.01)
    *H01L 29/786*    (2006.01)
    *H01L 29/66*     (2006.01)
    *H01L 21/02*     (2006.01)
    *H01L 21/8238*   (2006.01)
    *H01L 27/092*    (2006.01)
    *G06F 30/392*    (2020.01)

(52) U.S. Cl.
    CPC ............ *H01L 21/823807* (2013.01); *H01L 21/823814* (2013.01); *H01L 21/823828* (2013.01); *H01L 21/823871* (2013.01); *H01L 21/823878* (2013.01); *H01L 27/0922* (2013.01); *H01L 29/0673* (2013.01); *H01L 29/42392* (2013.01); *H01L 29/66545* (2013.01); *H01L 29/66742* (2013.01); *H01L 29/78696* (2013.01); *G06F 30/392* (2020.01)

(58) Field of Classification Search
    CPC ..... H01L 21/823814; H01L 21/823828; H01L 21/823871; H01L 21/823878; H01L 27/0922; H01L 29/0673; H01L 29/42392; H01L 29/66545; H01L 29/66742; H01L 29/78696; H01L 21/823412; H01L 27/088; H01L 27/092; H01L 27/0924; G06F 30/392
    USPC ........................................................ 257/351
    See application file for complete search history.

(56) References Cited

U.S. PATENT DOCUMENTS

| | | |
|---|---|---|
| 8,963,258 B2 | 2/2015 | Yu et al. |
| 9,093,530 B2 | 7/2015 | Huang et al. |
| 9,171,929 B2 | 10/2015 | Lee et al. |
| 9,214,555 B2 | 12/2015 | Oxland et al. |
| 9,236,267 B2 | 1/2016 | De et al. |
| 9,520,482 B1 | 12/2016 | Chang et al. |
| 9,548,303 B2 | 1/2017 | Lee et al. |
| 9,576,814 B2 | 2/2017 | Wu et al. |
| 11,075,195 B2 * | 7/2021 | Wang ................ H01L 29/66742 |
| 2013/0285116 A1 | 10/2013 | Lochtefeld et al. |
| 2016/0055285 A1 * | 2/2016 | Baek ..................... G06F 30/392 |
| | | 716/122 |

* cited by examiner

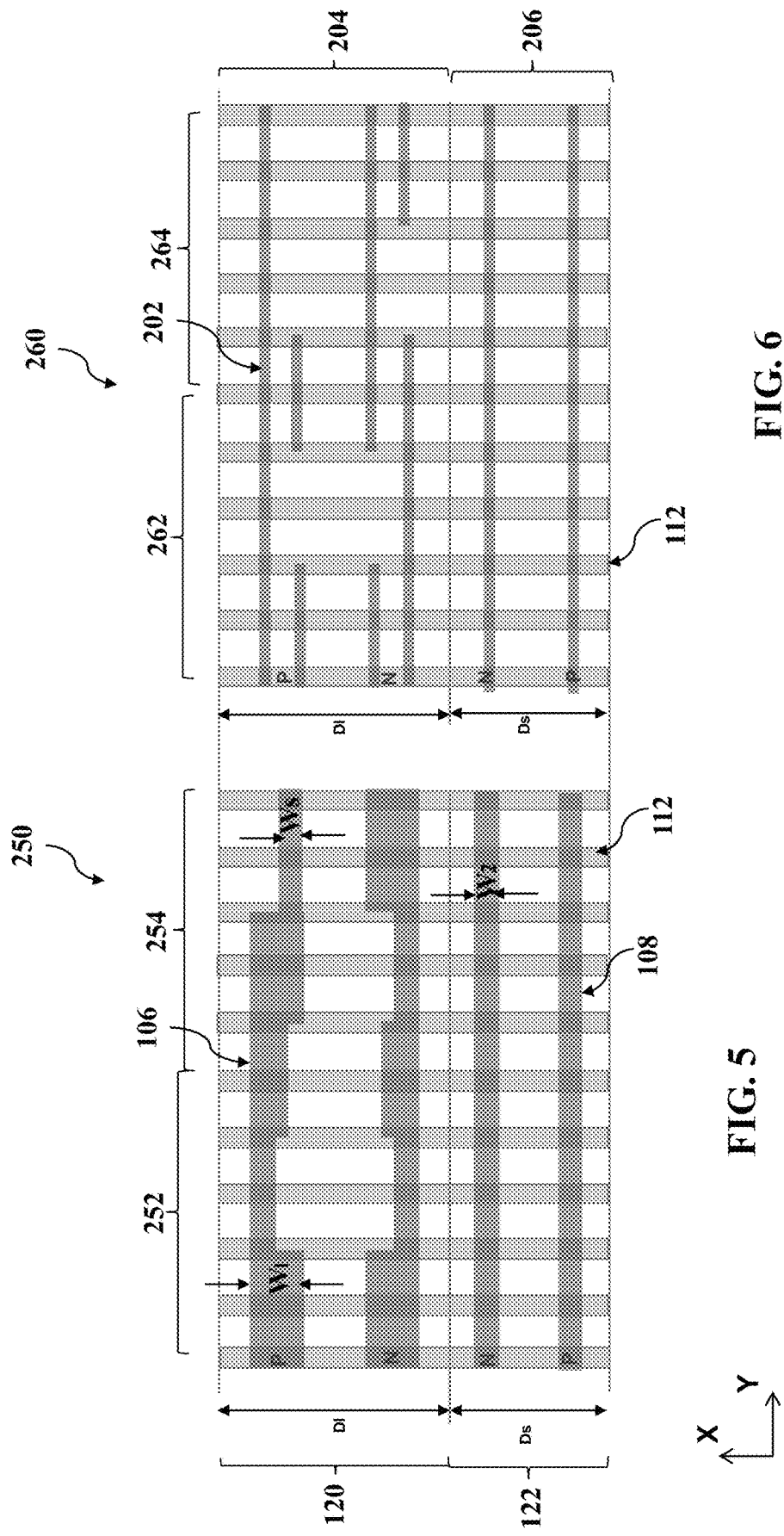

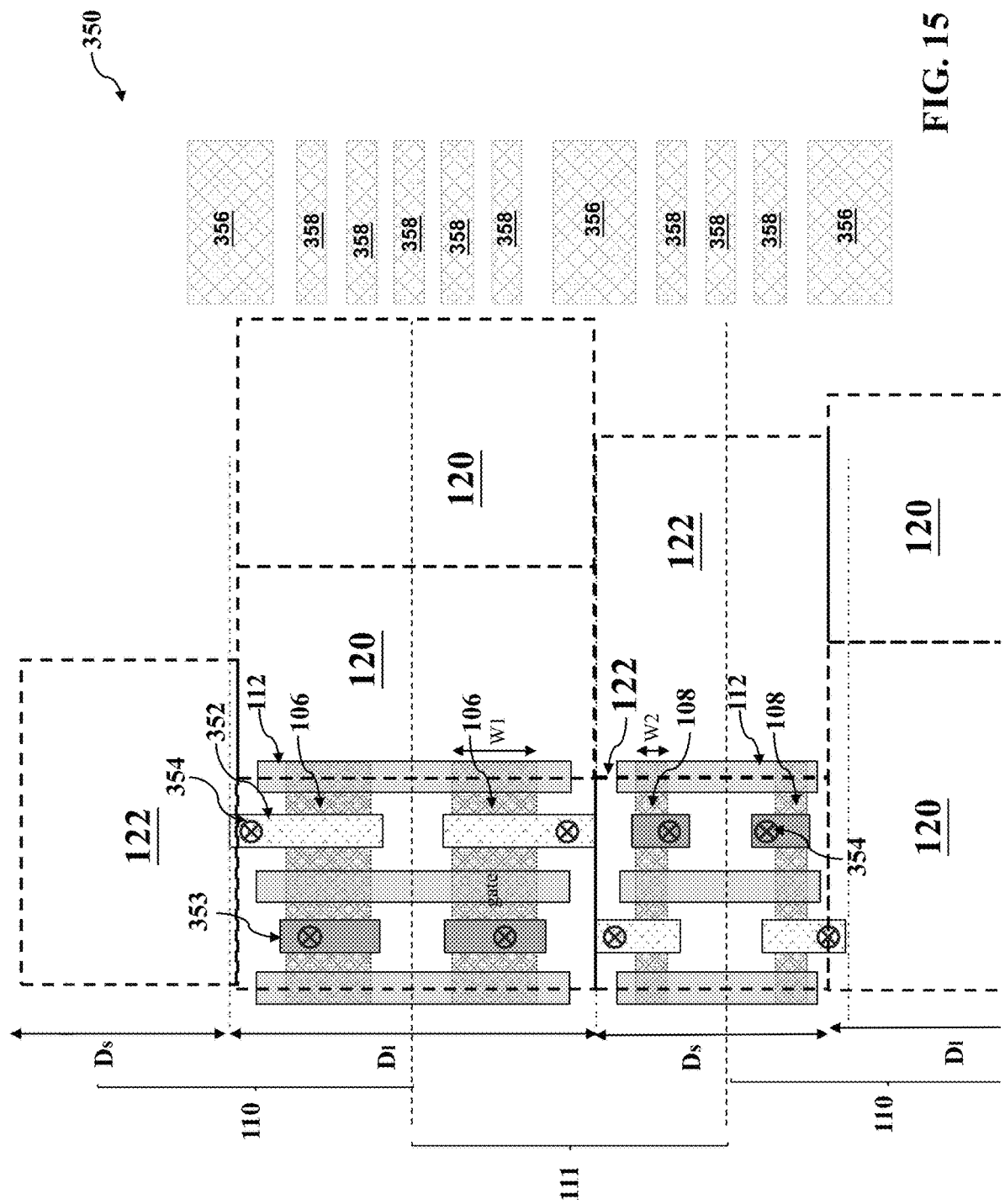

INTEGRATED HYBRID STANDARD CELL STRUCTURE WITH GATE-ALL-AROUND DEVICE

This application is a Continuation of U.S. patent application Ser. No. 16/727,731, filed Dec. 26, 2019, the entire disclosure of which is hereby incorporated herein by reference.

BACKGROUND

In the design of integrated circuits (IC), standard cells with certain functions are repeated used with high frequency. Accordingly, those standard cells are predesigned and packed in a cell library. The cell library is provided to the IC designers for their particular designing. During integrated circuit designing, the standard cells are retrieved from the cell libraries and placed into desired locations, thus reducing the design effort. Routing is then performed to connect the standard cells and other circuit blocks to form the desired integrated circuit. Pre-defined design rules are followed when placing the standard cells into the desired locations. For example, a standard cell is placed close to another standard cell, the space between those two standard cells is determined according to the pre-defined rules. The reserved space between the standard cells and the cell boundaries results in a significant increase in the areas of the standard cells. The packing density and performance of the resulting device is degraded. Layout patterns and configurations can affect the yield and the design performance of the standard cells. It is therefore desired to have an integrated circuit layout structure, and the method making the same to address the above issues.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

FIGS. 3, 4, 5, 6, 7, 8, 9, 10, 11, 12, 13, 14, 15 and 16 are top views of an IC structure constructed according to various embodiments.

DETAILED DESCRIPTION

Figure 1A:
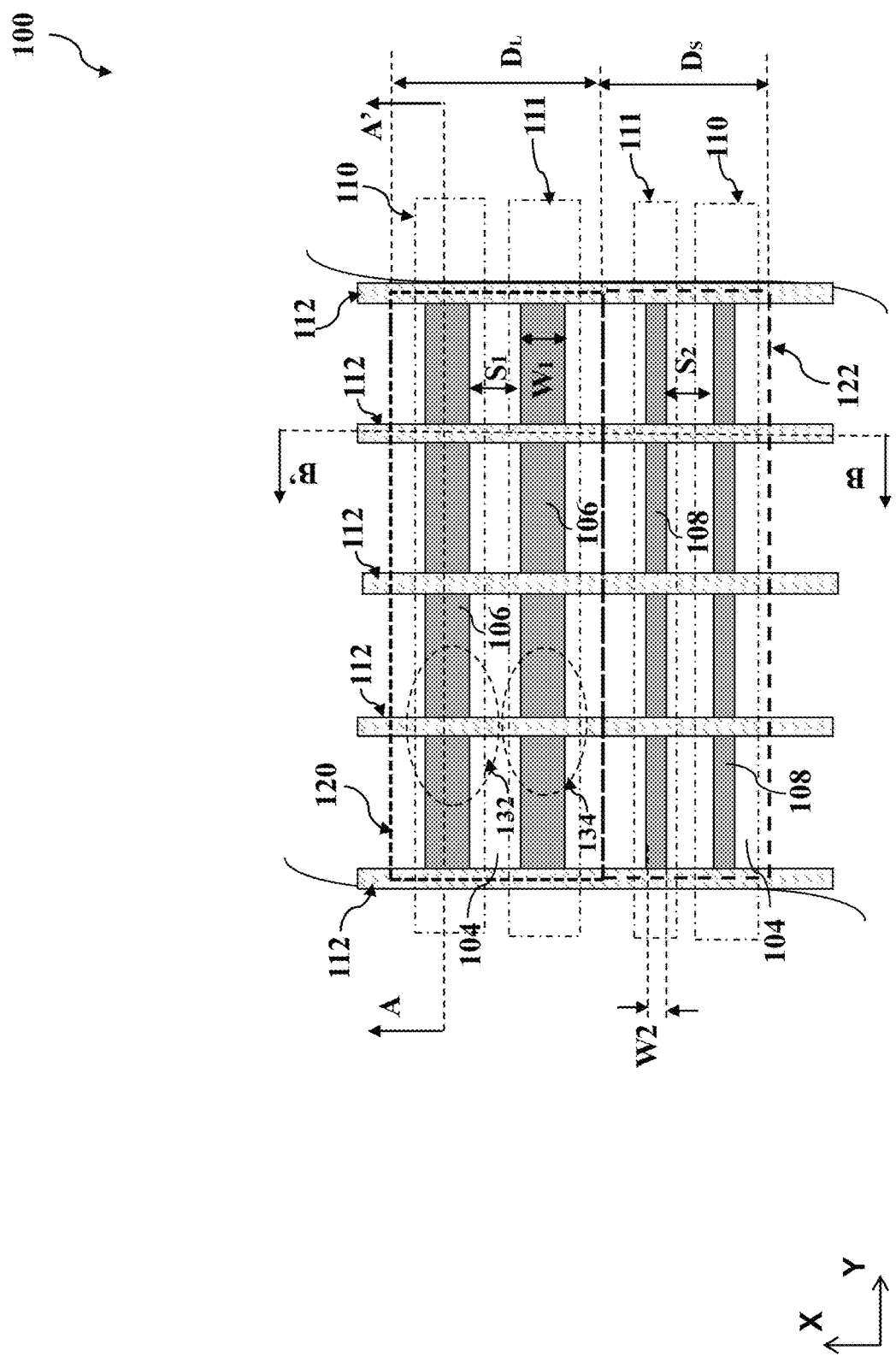
FIG. 1A is a top view of an integrated circuit (IC) structure constructed according to some embodiments.

The following disclosure provides many different embodiments, or examples, for implementing different features of the disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact and may also include embodiments in which additional features may be formed between the first and second features, such that the first and second features may not be in direct contact.

In addition, the present disclosure may repeat reference numerals and/or letters in the various examples. This repetition is for the purpose of simplicity and clarity and does not in itself dictate a relationship between the various embodiments and/or configurations discussed. Moreover, the formation of a feature on, connected to, and/or coupled to another feature in the present disclosure that follows may include embodiments in which the features are formed in direct contact, and may also include embodiments in which additional features may be formed interposing the features, such that the features may not be in direct contact. In addition, spatially relative terms, for example, "lower," "upper," "horizontal," "vertical," "above," "over," "below," "beneath," "up," "down," "top," "bottom," etc. as well as derivatives thereof (e.g., "horizontally," "downwardly," "upwardly," etc.) are used for ease of the present disclosure of one features relationship to another feature. The spatially relative terms are intended to cover different orientations of the device including the features. Still further, when a number or a range of numbers is described with "about," "approximate," and the like, the term is intended to encompass numbers that are within a reasonable range including the number described, such as within +/−10% of the number described or other values as understood by person skilled in the art. For example, the term "about 5 nm" encompasses the dimension range from 4.5 nm to 5.5 nm.

The present disclosure provides various embodiments of integrated circuit (IC) formed on a semiconductor substrate. The integrated circuit has a design layout incorporated with various standard cells. The standard cells are predesigned IC structure to be repeatedly used in individual IC designs. Effective IC design layouts include various predesigned standard cells and predefined rules of placing those standard cells for enhanced circuit performing and reduced circuit areas.

Figure 1B:
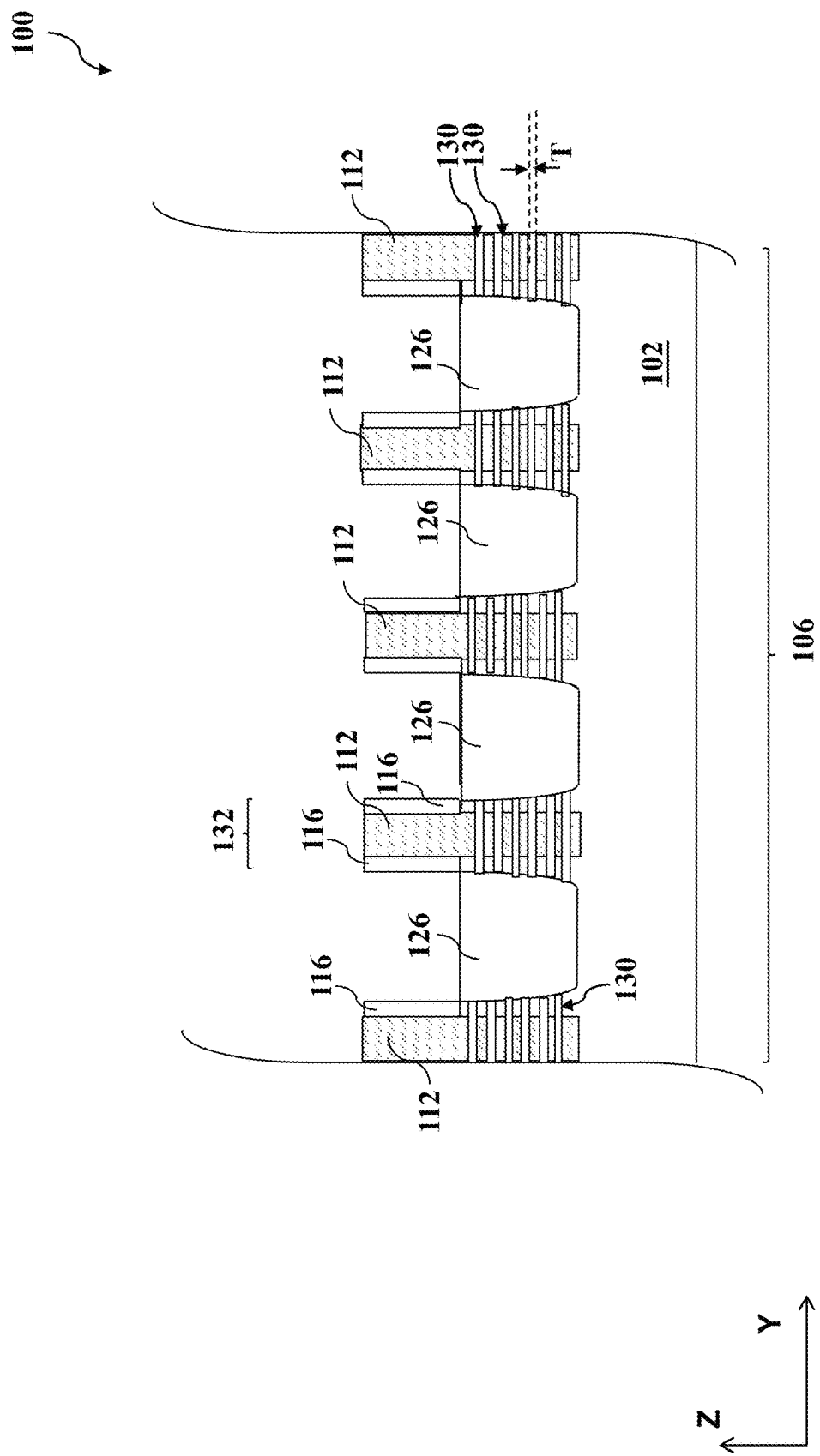
FIG. 1B is a sectional view of the IC structure of FIG. 1A along AA', constructed according to some embodiments.
Figure 1C:
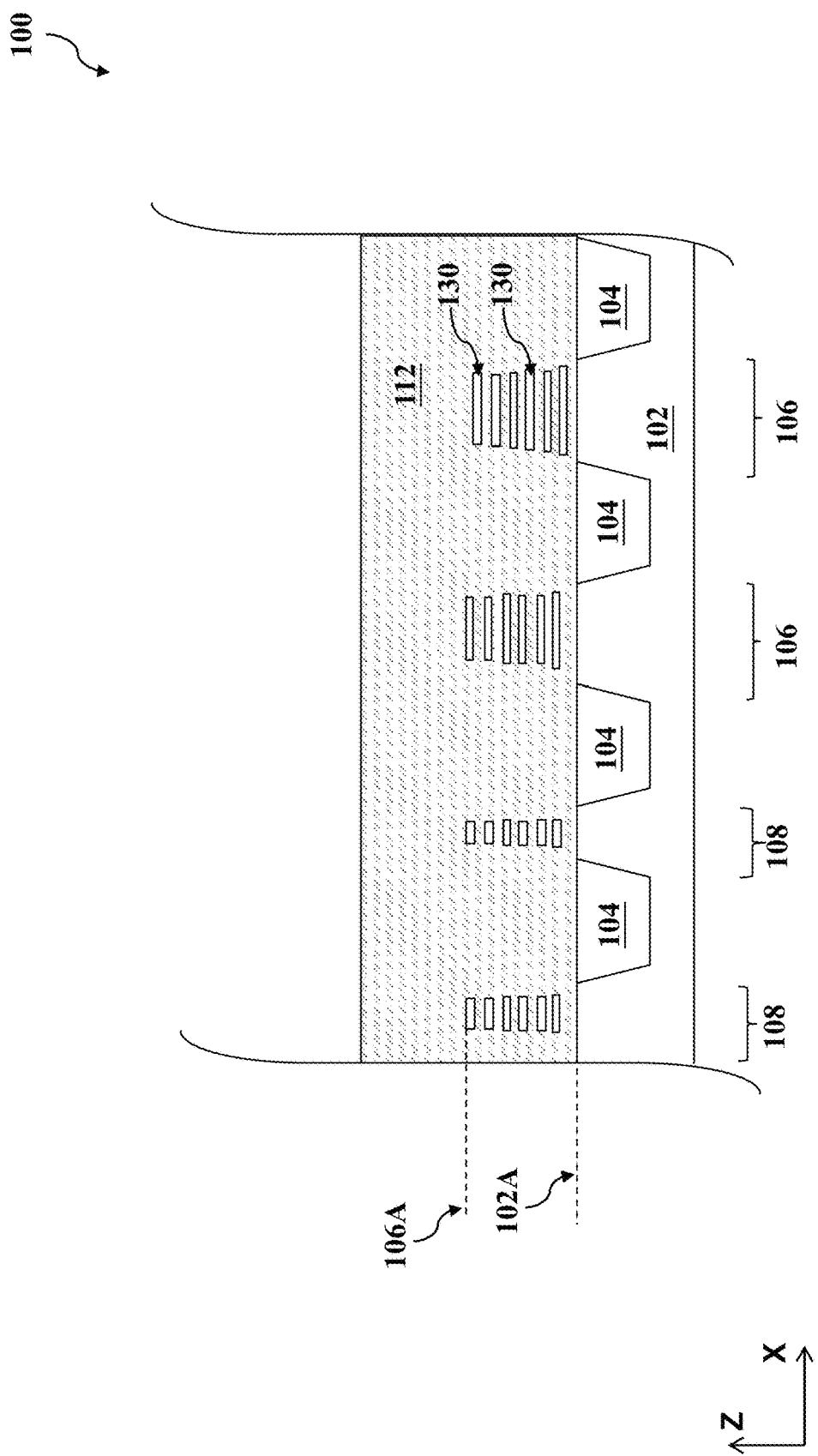
FIG. 1C is a sectional view of the IC structure of FIG. 1A along BB', constructed according to some embodiments.

FIG. 1A is a top view of an integrated circuit (IC) structure 100, FIG. 1B is a sectional view of the IC structure 100 along the dashed line AA', and FIG. 1C is a sectional view of the IC structure 100 along the dashed line BB', constructed according to various embodiments. In some embodiments, the IC structure 100 is formed on fin active regions and includes fin field-effect transistors (FinFETs). In some embodiments, the IC structure 100 is formed on flat active regions and includes effect transistors (FETs). In the present embodiment, the IC structure 100 includes a device structure with stacked channels or gate-all-around (GAA) field-effect transistors (GAA-FETs), such as nanosheet structure, nanowire structure or other nanochannel structures, in which multiple channels are vertically stacked and the gate stacks extend down to surround the multiple channels. With the IC structure 100 as an example for illustration, an IC structure and a method to incorporate standard cells are collectively described below.

In various embodiments, the semiconductor structure 100 includes one or more standard cell placed to the IC layout according to predefined rules. Those standard cells are repeatedly used in integrated circuit designs and therefore predesigned according to manufacturing technologies and saved in a standard cell library. IC designers could retrieve those standard cells, incorporate in their IC designs, and place into the IC layout according to the predefined placing rules. The standard cells may include various basic circuit devices, such as inverter, AND, NAND, OR, XOR, and NOR, which are popular in digital circuit design for applications, such as central processing unit (CPU), graphic processing unit (GPU), and system on chip (SOC) chip designs. The Standard cells may include other frequently used circuit blocks, such flip-flop circuit and latch. In the present embodiment illustrated in FIG. 1A, the IC structure 100 includes two standard cells 120 and 122, which will be further described later.

The semiconductor structure 100 includes a semiconductor substrate 102. The semiconductor substrate 102 includes silicon. Alternatively, the substrate 102 may include an elementary semiconductor, such as silicon or germanium in a crystalline structure; a compound semiconductor, such as silicon germanium, silicon carbide, gallium arsenic, gallium phosphide, indium phosphide, indium arsenide, and/or indium antimonide; or combinations thereof. Possible substrates 102 also include a silicon-on-insulator (SOI) substrate. SOI substrates are fabricated using separation by implantation of oxygen (SIMOX), wafer bonding, and/or other suitable methods. In the present embodiments, the semiconductor structure 100 includes a stack of alternative silicon (Si) films and silicon germanium (SiGe) films epitaxially grown on the silicon substrate 102. During a wire-release process, one type of films, such as SiGe films, are selectively removed, another type of films, such as Si films, are patterned to form a plurality of channels 130 vertically stacked. The gate stacks 112, each including a gate dielectric layer and a gate electrode, extend down to around various channels 130 to form respective GAA devices, also referred to as GAA field-effect transistors (GAA-FETs), such as GAA-FETs 132 and 134, as illustrated in FIG. 1A. The IC structure 100 may further include dielectric spacers (or gate spacers) 116 disposed on sidewalls of the gate stacks 112.

The substrate 102 also includes various isolation features, such as isolation features 104, formed on the substrate 102 and defining various active regions 106 and 108 on the substrate 102. The isolation feature utilizes isolation technology, such as shallow trench isolation (STI), to define and electrically isolate the various active regions. Each active region (e.g., 106 or 108) is surrounded by a continuous isolation feature 104 such that it is separated from other adjacent active regions. The isolation feature 104 includes silicon oxide, silicon nitride, silicon oxynitride, other suitable dielectric materials, or combinations thereof. The isolation feature 104 is formed by any suitable process. As one example, forming an isolation structure having STI features includes a lithography process to expose a portion of the substrate, etching a trench in the exposed portion of the substrate (for example, by using a dry etching and/or wet etching), filling the trench (for example, by using a chemical vapor deposition process) with one or more dielectric materials, and planarizing the substrate and removing excessive portions of the dielectric material(s) by a polishing process, such as a chemical mechanical polishing (CMP) process. In some examples, the filled trench may have a multi-layer structure, such as a thermal oxide liner layer and filling layer(s) of silicon nitride or silicon oxide.

An active region, such as 106 and 108, is a region with semiconductor surface wherein various doped features are formed and configured to one or more device, such as a diode, a transistor (e.g., FETs or GAA-FETs), and/or other suitable devices. The active regions (106 or 108) may include a semiconductor material similar to the bulk semiconductor material (such as silicon) of the substrate 102 or different semiconductor material, such as silicon germanium (SiGe), silicon carbide (SiC), or multiple semiconductor material layers (such as alternative silicon and silicon germanium layers) formed on the substrate 102 by epitaxial growth for performance enhancement (e.g., strain effect to increase carrier mobility).

In some embodiments, the active region (106 or 108) is three-dimensional, such as a fin active region extended above the STI feature. The fin active region is extruded from the substrate 102 and has a three-dimensional profile for more effective coupling between the channel and the gate electrode of a FET. Particularly, the fin active region has a top surface 106A that is above a top surface 102A of the semiconductor substrate 102, as illustrated in FIG. 1C. The fin active region may be formed by selective etching to recess the isolation features 104, or selective epitaxial growth to grow active regions with a semiconductor same or different from that of the substrate 102, or a combination thereof.

The semiconductor substrate 102 further includes various doped features, such as n-type doped wells, p-type doped wells, source and drain features, other doped features, or a combination thereof configured to form various devices or components of the devices, such as source and drain features of a field-effect transistor. In some examples, the IC structure 100 includes an n-type doped well (also referred to as N well) 110 and a p-type doped well (also referred to as P well) 111 for respective p-type FETs and n-type FETs to be formed thereof. The N well 110 includes negative dopant, such as phosphorus. And the P well 111 includes positive dopant, such as boron. The N well 110 and the P well 111 are formed by suitable technologies, such as ion implantation, diffusion or a combination thereof. In one embodiment, one of the active regions 106 and one of the active region 108 are disposed in the N wells 110 and the rest active regions (106 and 108) are disposed in the P wells 111, as illustrated in FIG. 1A.

Various IC devices are formed on the semiconductor substrate 102. The IC devices includes field-effect transistors (FinFETs), diodes, bipolar transistors, imaging sensors, resistors, capacitors, inductors, memory cells, or a combination thereof. The FETs may include fin FETs or GAA-FETs. In FIGS. 1B and 1C, exemplary GAA-FETs are provided according to some embodiments.

The IC structure 100 further includes various gate stacks (or simply gates) 112 having elongated shape oriented in a first direction (X direction). In the present embodiment, X and Y directions are orthogonal and define the top surface 102A of the semiconductor substrate 102. A gate stack 112 includes a gate dielectric layer and a gate electrode. The gate stack 112 is a feature of a FET and functions with other features including source/drain (S/D) features and a channel, wherein the channel is a portion of the active region directly underlying the gate stack; and the S/D features are formed on the active region and are disposed on two sides of the gate stack 112. It is noted that the gate stack (or gate) 112 is the gate of a FET and should not be confused with a logic gate, such as a NOR logic gate.

Figure 1D:
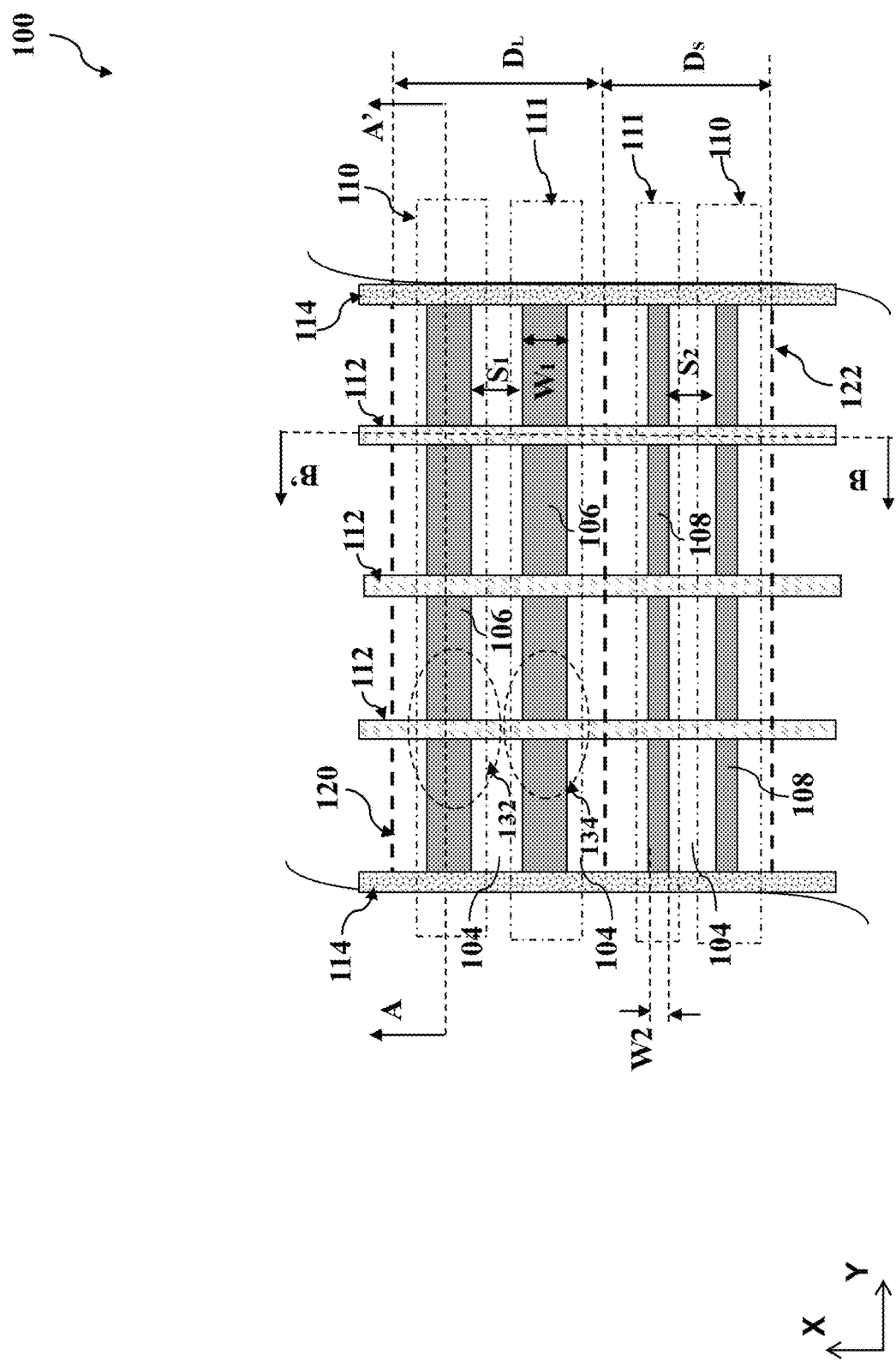
FIG. 1D is a top view of an IC structure constructed according to some other embodiments.

The IC structure 100 may additionally or alternatively include dielectric gates 114 disposed on the semiconductor substrate 102, as illustrated in FIG. 1D according to some embodiments. A dielectric gate 114 is not a gate and does not function as a gate. Instead, the dielectric gate 114 is a dielectric feature that includes one or more dielectric material and function as an isolation feature, in some instances. Each of the dielectric gates 114 also has an elongated shape oriented in the X direction. The dielectric gates 114 are similar to the gate stacks 112 in term of formation. In some embodiments, the gate stacks 112 and the dielectric gates 114 are collectively formed by a procedure, such as a gate-last process. In furtherance of the embodiments, dummy gates are first formed by deposition and patterning, in which the patterning further includes lithography process and etching. Afterward, a subset of the dummy gates is replaced to form gate stacks 112 by depositing a gate dielectric layer and a gate electrode while the rest of the dummy gates are replaced to form dielectric gates 114 by depositing only dielectric material(s). Furthermore, the dielectric gate 114 is disposed and configured differently and therefore functions differently. In some embodiments, some dielectric gates 114 are placed on the edges of the standard cells to function as isolation to separate one standard cell to an adjacent standard cell, and some dielectric gates are placed inside the standard cells for one or more considerations, such as isolation between the adjacent FETs and/or adjust pattern density. Thus, the dielectric gate provides isolation function between adjacent IC devices and additionally provides pattern density adjustment for improved fabrication, such as etching, deposition and CMP. In some embodiments (such as in FIG. 1D), the dielectric gates 114 are formed at the edges of the standard cells 120 and 122.

The IC structure 100 includes various standard cells placed and configured on the semiconductor substrate 102 according to the predefined rules. In some embodiments, a standard cell is a group of transistor and interconnect structures that provides a Boolean logic function (such as AND, OR, XOR, XNOR, or inverters), a storage function (such as flipflop or latch) or other suitable functions. Those standard cells are pre-designed and collected in an IC standard cell library for repeatedly use during IC design for compatible, consistent, and efficient IC design and IC fabrication. Proper design and configuration of the standard cells can enhance the packing density and circuit performance.

In the present embodiment, the IC structure 100 includes a first standard cell 120 and a second standard cell 122 placed edge to edge. Edges (or boundary lines) of the standard cells are illustrated by the dashed lines in FIG. 1A (or FIG. 1D in another embodiment). In the present embodiment, the first standard cell 120 and the second standard cell 122 are placed next each other. The first standard cell 120 is a large cell with a first dimension (or height) $D_L$, and the second standard cell 122 is a small cell with a second dimension (or height) $D_S < D_L$. The first standard cell 120 and the second standard cell 122 are also referred to as large standard cell (LSC) 120 and small standard cell (SSC) 122. The IC structure 100 in FIGS. 1A, 1B and 1C is an example to illustrate how different standard cells are designed and integrated together differently. It is not intended to be limiting to the scope of the present disclosure. An IC structure may have other configuration without departure of the disclosed scope, such as the IC structure illustrated in FIG. 1D or other structures to be introduced later. The large standard cells 120 and small standard cells 122 are defined according to respective heights, or dimensions along the X direction while active regions are oriented along the Y direction. In the present design, $D_L > D_S$. For example, $D_L/D_S$ is greater than 1.2 or more particularly, greater than 1.5. Furthermore, the active regions in the large standard cell 120 and the small standard cell 122 have different structure and different dimensions. Therefore, the IC structure 100 is referred to as a hybrid IC structure.

The small standard cell 122 and the large standard cell 120 have different sizes, and include active regions (106 and 108 respectively) and channels 130 designed differently, such as with different channel widths, so that the circuit packing density is increased while the device performance and the processing window are enhanced. In the present embodiment, the active regions in the large standard cell 120 and the small standard cell 122 have different widths spanning along the X direction. The active region 106 in the large standard cell 120 has a first width $W_1$ and the active region 108 in the small standard cell 122 has a second width $W_2 < W_1$. The active region 106 with the first width $W_1$ is referred to as wide active region, and the active region 108 with the second width $W_2$ is referred to as narrow active region. The corresponding channels on the wide active regions 106 and the narrow active regions 108 are wider ($W_1$) and narrower ($W_2$), respectively. In various examples, $W_1/W_2$ is greater than 1.5 or more particularly, greater than 5 in some example. The channels 130 have a thickness T as illustrated in FIG. 1B. T is substantially less than $W_1$ and $W_2$. For example, $W_2/T$ is greater than 1.5. Accordingly, those GAA structures are referred to as nanosheet (NS) structures. Particularly, the wide channels in the large standard cell 120 are referred to as wide nanosheets (WNS) and the narrow channels in the small standard cell 122 are referred to as narrow nanosheets (NNS). Furthermore, compared between the large standard cell 120 and the small standard cell 122, the widths of the corresponding active regions are different but the spacing between the adjacent active regions in the large standard cell 120 and the small standard cell 122 are the same. Accordingly, the pitches along the X directions for the large standard cell 120 and the small standard cell 122 are different to match the corresponding heights ($D_l$ and $D_s$). Here the pitch is the dimension measured from the same location of the adjacent features, such as center to center.

Each standard cell includes one or more gate stack 112 configured to form one or more field-effect transistor (FET). In the present embodiment, a plurality of gate stacks 112 are oriented along the X direction and extended through the large standard cell 120 and the small standard cell 122. The gate stacks 112 may be equally distanced according to some embodiments. In other words, all gate stacks 112 (or additionally including dielectric gates 114 according to some other embodiments) are configured into a periodic structure with a pitch $P_y$ along the Y direction. In the present embodiment, both the large standard cell 120 and the small standard cell 122 span a same dimension along the Y direction. For example, the large standard cell 120 spans a four-pitch dimension $4*P_y$ along the Y direction. Similarly, the small standard cell 122 spans a four-pitch dimension $4*P_y$ along the Y direction.

In the present embodiment, each active region 106 has a continuous structure extending over the whole cell along the Y direction. The small standard cell 122 is placed edge by edge with the large standard cell 120 such that the isolation features 104 on the cell edges are merged together and the respective gate stacks 112 are aligned and merged together to be continuous.

Along the X direction, a pitch can be defined similarly. All active regions are configured into a structure with a pitch $P_x$ along the X direction. The pitch $P_x$ is the dimension measured from the same location of the adjacent features (active regions), such as center to center, along the X direction. Accordingly, the large standard cell 120 has a pitch $P_{x-1}$ and the small cell 122 has a pitch $P_{x-2}$ along the X direction. The parameters $S_1$ and $S_2$ are spacings among the adjacent active regions in the large standard cell 120 and the small standard cell 122, respectively. Accordingly, $P_{x-1}=S_1+W_1$ in the first standard cell 120 and $P_{x-2=S_2}+W_2$ in the second standard cell 122. In the present embodiment, $S_1$ is designed to be equal to $S_2$ for better device performance and process window. The pitches and widths are designed differently for the large cell 120 and the small cell 122 in order to have better device performance, circuit packing density and process window. Here the process window refers to the margins of the process to form a structure without degrading the circuit performance and is also referred to as fabrication capability.

In the present embodiment, the large standard cell 120 includes one of the first active regions 106 in an N-well 110 for pFETs and one of the first active regions 106 in a P-well 111 for nFETs; and similarly, the small standard cell 122 includes one of the second active regions 108 in an N-well 110 for pFETs and one of the second active regions 108 in a P well 111 for nFETs. The gate stacks 112 in the large standard cell 120 and the small standard cell 122 extend continuously from farthest cell edge of the small standard cell 122 to the farthest cell edge of the large standard cell 120 along the X direction.

With a source 126 and a drain 126 (or collectively referred to as source/drain features or S/D features), a gate stack 112, and a channel 130 of each field-effect transistor formed on a respective active region and a respective standard cell, the large standard cell 120 includes one exemplary p-type FET (pFET) 132 in the N-well 110 and one exemplary n-type FET (nFET) 134 in the P-well 111.

Thus, the adjacent standard cells have different sizes to ensure circuit packing density; have different active region structures and channels to ensure device performance; and a same spacing between the active regions in a same cell to ensure process window. In some embodiments, the active regions may be continuous through multiple cells. The continuity of the active regions maintains a regular layout for fabrication friendliness. In some embodiments, a dielectric gate is additionally added to a standard cell for isolation and, pattern density. For example, a transistor is always placed next to a dielectric gate, the design uncertainty is reduced. Furthermore, the uniform local density of the gate stacks 112 (and the dielectric gates 114) leads to better device performance and process margin.

When placing a standard cell next to another standard cell, the above defined layout rules applied. Generally, multiple standard cells may be thus placed in a cascade mode. For examples, large cells and small cells are alternatively placed. Various layout of the standard cells and the corresponding layout rules are further described below according to various embodiments.

Figure 2A:
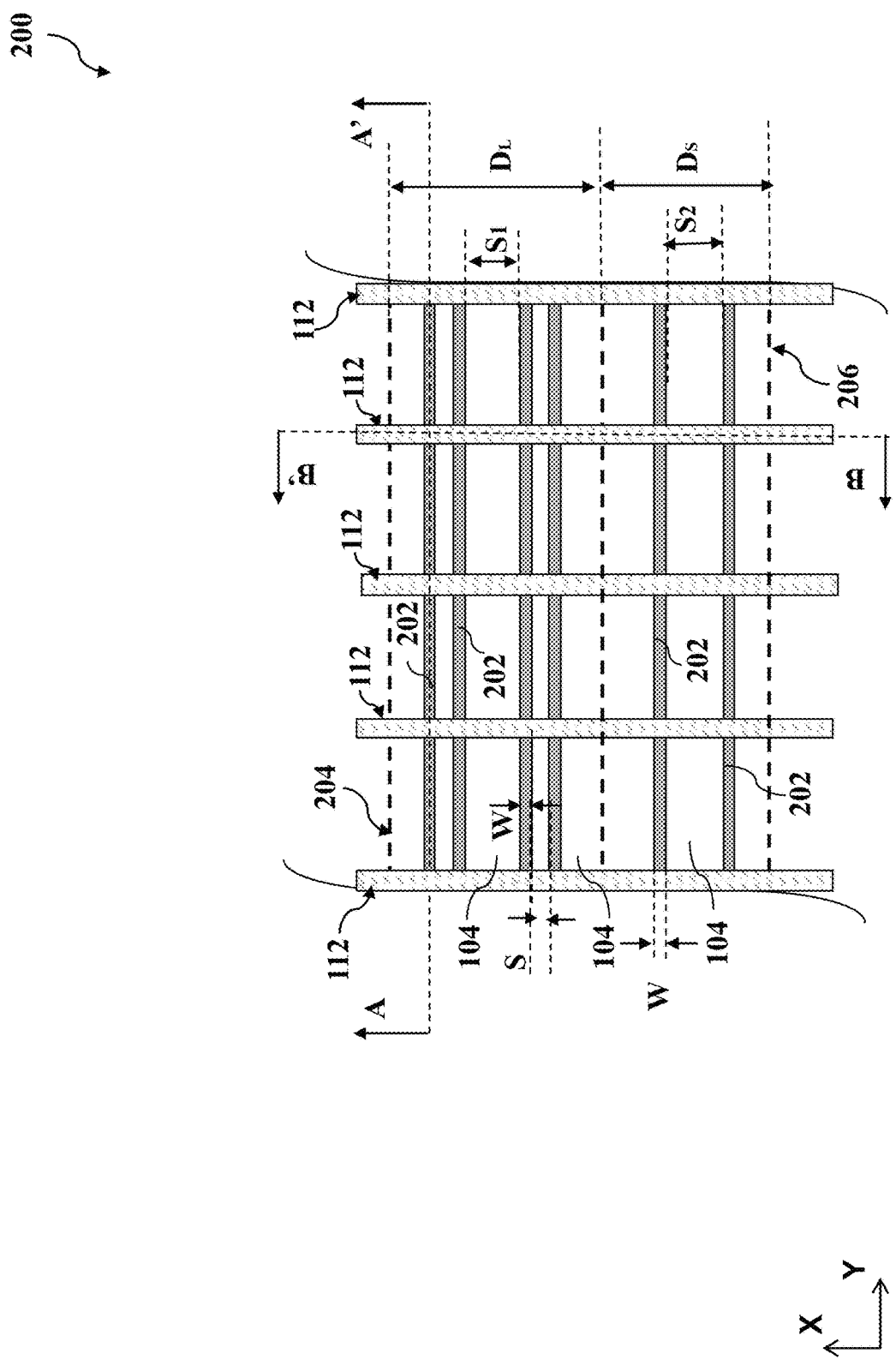
FIG. 2A is a top view of an IC structure constructed according to some embodiments.
Figure 2B:
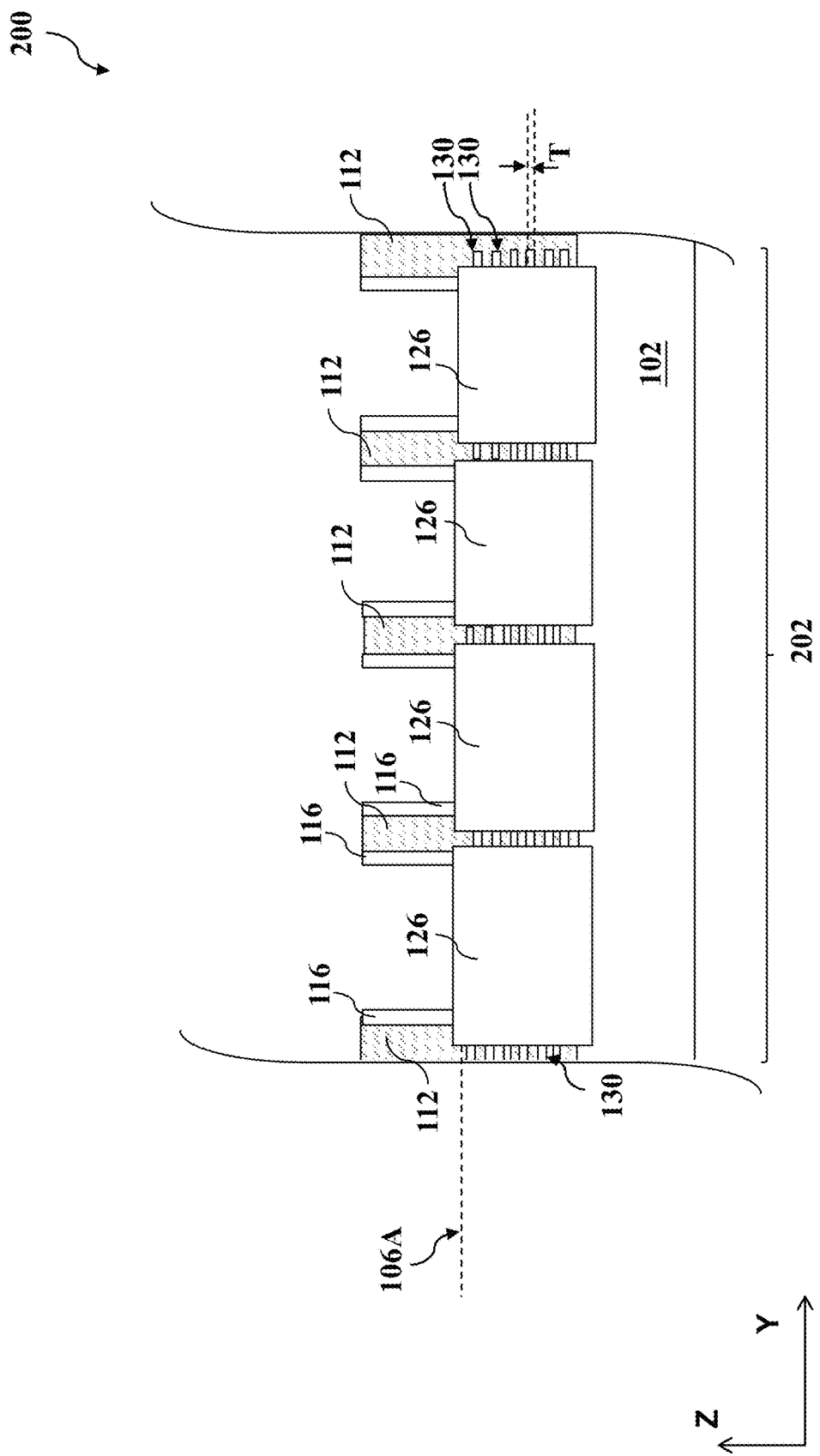
FIG. 2B is a sectional view of the IC structure of FIG. 2A along AA', constructed according to some embodiments.
Figure 2C:
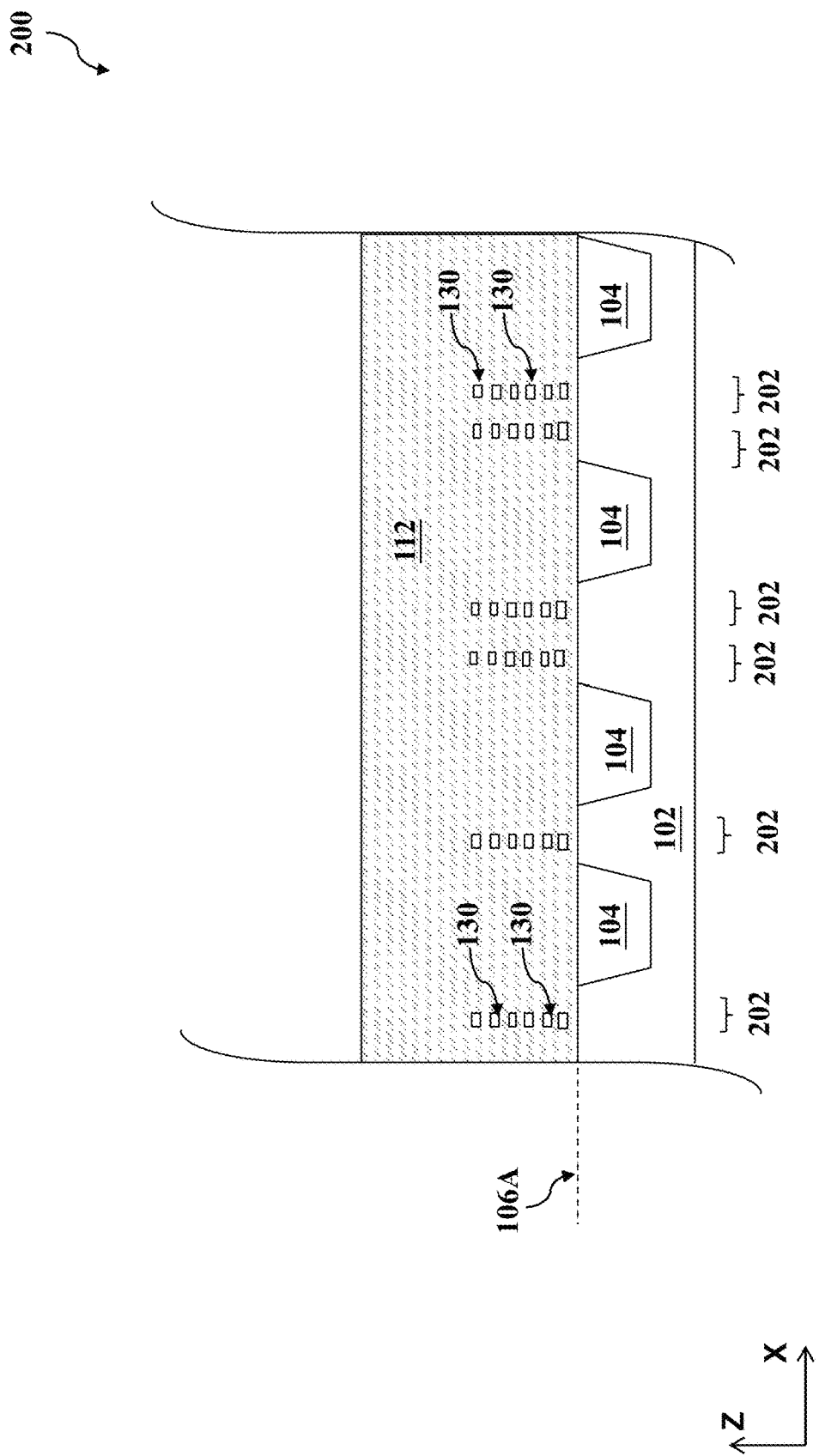
FIG. 2C is a sectional view of the IC structure of FIG. 2A along BB', constructed according to some embodiments.

FIG. 2A is a top view of an integrated circuit (IC) structure 200, FIG. 2B is a sectional view of the IC structure 200 along the dashed line AA', and FIG. 2C is a sectional view of the IC structure 200 along the dashed line BB' of FIG. 2A, constructed according to various embodiments. In some embodiments, the IC structure 200 is formed on fin active regions and includes FinFETs. In some embodiments, the IC structure 200 is formed on flat active regions and includes FETs. In the present embodiment, the IC structure 200 includes GAA-FETs with multiple channels vertically stacked on. The IC structure 200 also includes a large standard cell 204 and a small standard cell 206 placed edge by edge. with similar design rules applied to the IC structure 100, the active regions in the two sized standard cells (204 and 206) have different widths but a same spacing for enhanced packing density, device performance and process window. However, the active regions adopt different structure and the widths are varied in different way. A number N of nanowire (NW) structures 202 are used for an active region. When the active region is varied to have a greater width in the large standard cell 204, the corresponding number $N_l$ is increased. When the active region is varied to have a less width in the small standard cell 206, the corresponding number $N_s$ is decreased. For examples, $N_l$ and $N_s$ are respectively 2 and 1; 3 and 1; 3 and 2; and etc. The nanowire structure is defined as below. The corresponding channels 130 in the nanowire structure each have a width W and a thickness T (as illustrated in FIG. 2B), in which T is substantially equal or close to W. In one example, the relative different between W and T (defined as |W−T|/W) is less than 30%. In some other examples, the ratio W/T ranges between 1 and 1.6. The IC structure 200 is further described below.

The IC structure 200 also includes a large standard cell 204 and a small standard cell 206 configured similarly as those of the IC structure 100 in FIGS. 1A through 1C, such as two cells being placed edge by edge. The large standard cell 204 and the small standard cell 206 have different sizes $D_l$ and $D_s$, in which $D_s$ is substantially less than $D_l$. For example, $D_l/D_s$ is greater than 2.

The large standard cell 204 includes a first set of fin active regions 202 and a second set of fin active regions 202. The two sets of fin active regions are spaced away from each other with a first spacing $S_1$. The second standard cell 206 also includes a first set of fin active regions and a second set of fin active regions with a second spacing $S_2$ therebetween. The first spacing $S_1$ and the second spacing $S_2$ are equal: $S_3=S_2$. Each set of active regions in the large standard cell 204 includes 2 fin active regions 202 while each set of active regions in the small standard cell 206 includes only 1 fin active regions 202, or $N_l=2$ and $N_s=1$ in other words. All active regions 202 have a NW structure, and the corresponding channels have a same width W and a same thickness T. If there is two or more fin active region in each set of active regions (such as $N_l>1$ or $N_s>1$), there the spacing between adjacent active regions 202 in that set is S or referred to intra-spacing. The intra-spacing S is less than $S_1$ or $S_2$. In some embodiments, $S_1/S>1.5$.

Other aspects of the IC structure 200 are similar to the corresponding aspects of the IC structure 100 in FIGS. 1A-1C or FIG. 1D. For example, the IC structure 200 also includes GAA-FET structure with multiple channels stacked vertically. The gate stacks 112 continuously extend from the large standard cell 204 to the small standard cell 206. The IC structure 200 may additionally include one dielectric gates 114 placed on cell edges or interposed between nFETs and pFETs for isolations and/or uniform pattern density.

Figure 3:
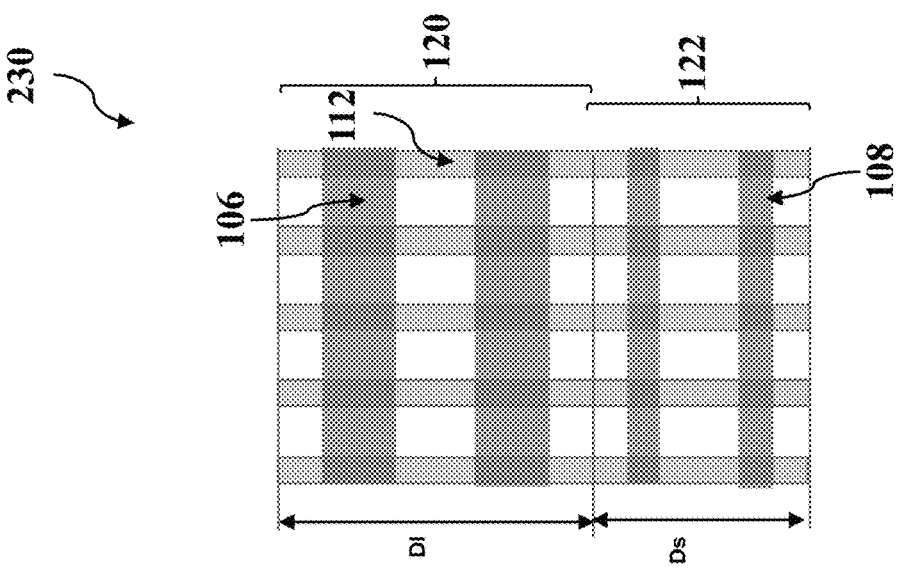

Various embodiments are provided below. FIG. 3 is a top view of the IC structure 230 constructed in accordance with some embodiments. The IC structure 230 is similar to the IC structure 100. The active regions 106 and 108 have respective constant widths.

Figure 4:
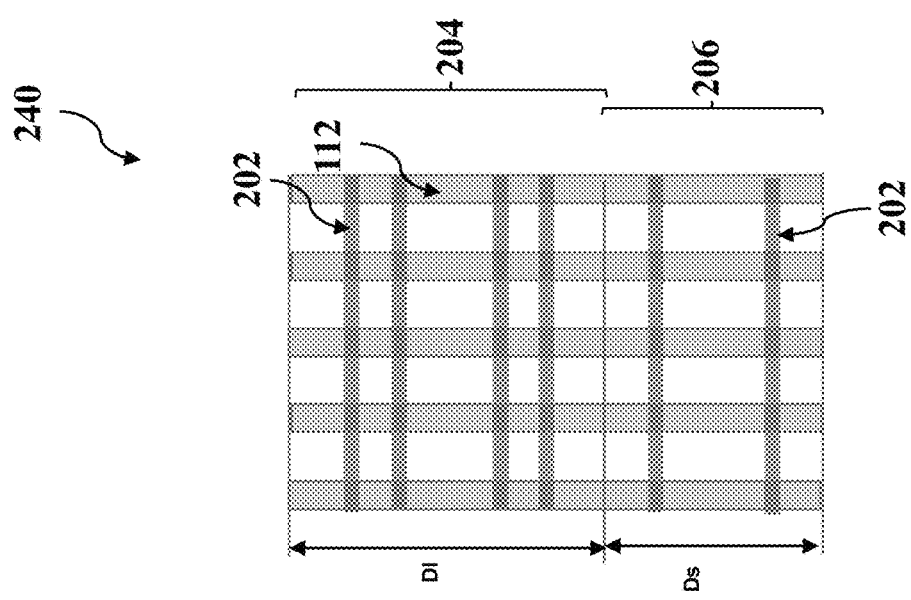

FIG. 4 is a top view of the IC structure 240 constructed in accordance with some embodiments. The IC structure 240 is similar to the IC structure 200. The channels are vertically stacked and have a NW structure, in which each channel has a thickness and a width being substantially equal.

FIG. 5 is a top view of an IC structure 250 constructed in accordance with some embodiments. The IC structure 250 is similar to the IC structure 100 but each of the active regions 106 in the large standard cell 120 has a varying width along the Y direction. Accordingly, the width of channels 130 formed in that active regions 106 varies in a same way. The width varies from the greater width $W_g$ to the smallest width $W_s$ wherein the smallest width $W_s$ in the large standard cell is greater or equal to the width $W_2$ of the active regions in the small standard cell. The ratio $W_l/W_s$ is greater than 2 or 3 in various examples. In some embodiments, the channels 130 include one portion 252 having segments of the active regions configured symmetric and another portion 254 having segments configured asymmetric.

FIG. 6 is a top view of an IC structure 260 constructed in accordance with some embodiments. The IC structure 260 is similar to the IC structure 200 but the active regions 106 (accordingly the channels formed in the active regions 106 as well) are not continuous along the Y direction. Furthermore, each of the active regions 202 in the large cell 204 includes segments aligned with and distanced away from each other. In some embodiments, the channels 130 include one portion 262 with segments of active regions configured symmetric and another portion 264 with segments of active regions configured asymmetric.

Figure 7:
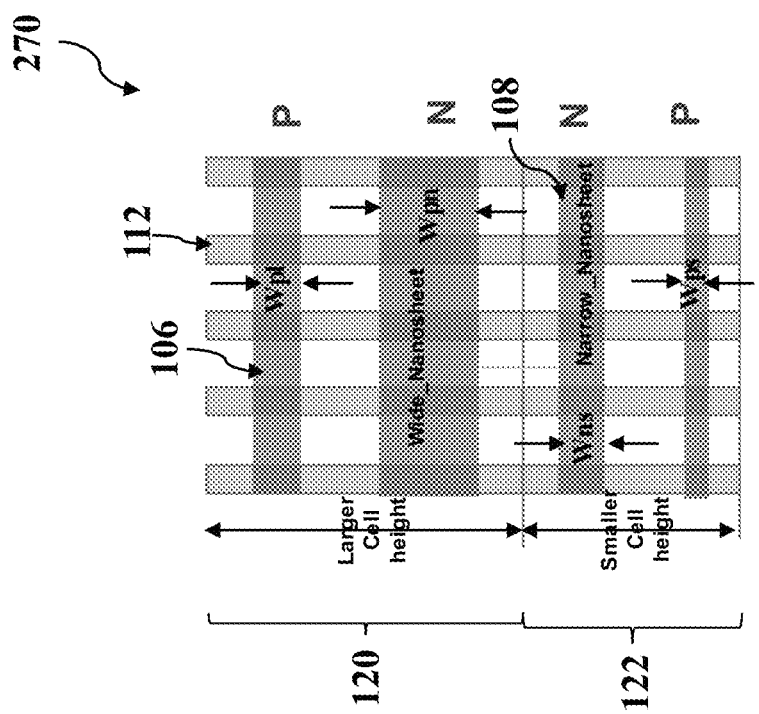

FIG. 7 is a top view of an IC structure 270 constructed in accordance with some embodiments. The IC structure 270 is similar to the IC structure 100 but the active regions 106 (and 108) are unbalanced or have different widths in other words. Particularly, the active region 106 (accordingly the channels formed in the active regions 106) in the large standard cell 120 for pFETs has a width Wpl greater than the width Wnl of the active region 106 for nFETs to match the device (nFETs and pFETs) parameters and circuit performance. For example, Wnl/Wpl>1.5. Similarly, the active region 108 (accordingly the channels formed in the active regions 108) in the small standard cell 122 for pFETs has a width Wps greater than the width Wns of the active region 108 for nFETs to match the device (nFETs and pFETs) parameters and circuit performance. For example, Wns/Wps>1.5.

Figure 8:
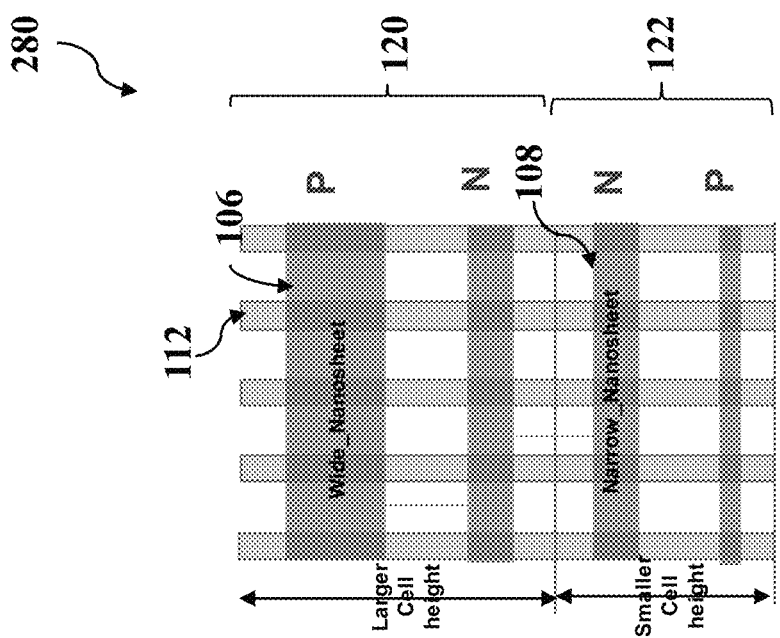

FIG. 8 is a top view of an IC structure 280 constructed in accordance with some embodiments. The IC structure 280 is similar to the IC structure 100 but the active regions 106 and 108 are unbalanced. Particularly, the active region 106 (accordingly the channels formed in the active regions 106) in the large standard cell 120 for pFETs has a width Wpl less than the width Wnl of the active region 106 for nFETs to match the device (nFETs and pFETs) parameters and circuit performance. For example, Wpl/Wnl>1.5. Accordingly, the active region 108 (accordingly the channels formed in the active regions 108) in the small standard cell 122 for pFETs has a width Wps less than the width Wns of the active region 108 for nFETs to match the device (nFETs and pFETs) parameters and circuit performance. For example, Wns/Wps>1.5.

Figure 9:
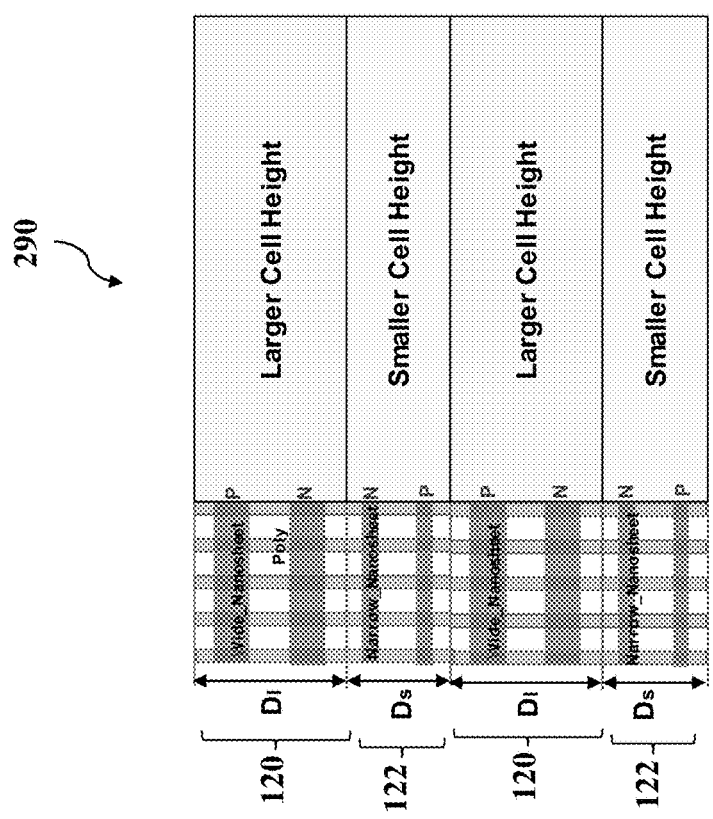

FIG. 9 is a top view of an IC structure 290 having multiple standard cells placed in series edge by edge constructed according to one embodiment. The standard cells include large cells, such as 120, and small cells, such as 122. Particularly, the large standard cells 120 and small standard cells 122 are alternatively placed for various reasons, such as device performance and uniformity for fabrication.

Figure 10:
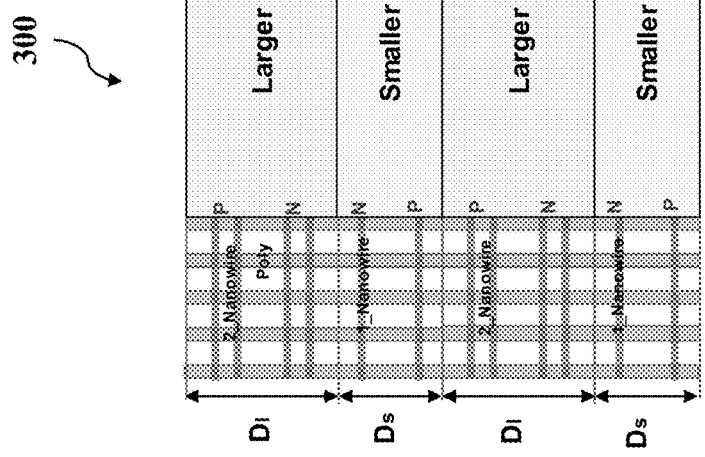

FIG. 10 is a top view of an IC structure 300 having multiple standard cells placed in series edge by edge constructed according to one embodiment. The standard cells include large cells, such as 204, and small cells, such as 206. Particularly, the large standard cells 204 and small standard cells 206 are alternatively placed. In some other embodiments, the large standard cells 204 and small standard cells 206 are mixed and placed alternatively.

Figure 11:
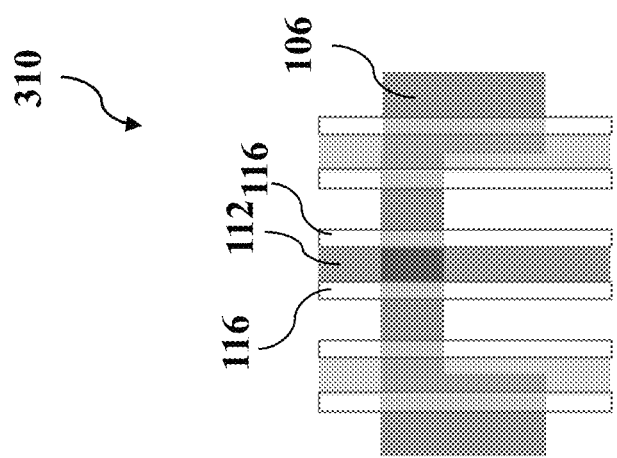

FIG. 11 is a top view of an IC structure 310, in portion, constructed according to one embodiment. The active region 106 includes a varying width and an L-shaped geometry. The gate structure further includes a gate spacer 114 disposed on sidewall of the gate stack 112.

Figure 12:
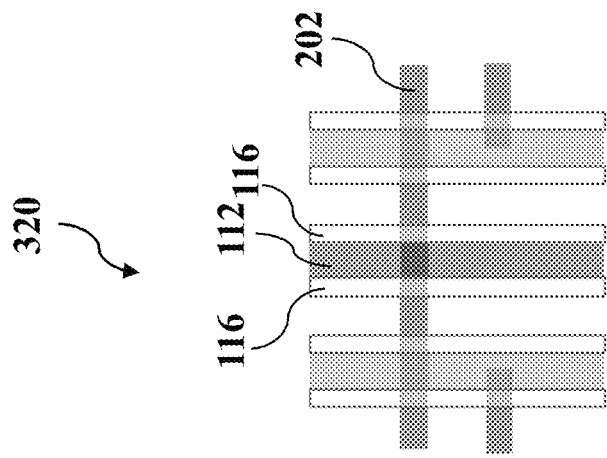

FIG. 12 is a top view of an IC structure 320, in portion, constructed according to one embodiment. The active region 202 segments aligned and distanced away from each other.

Figure 13:
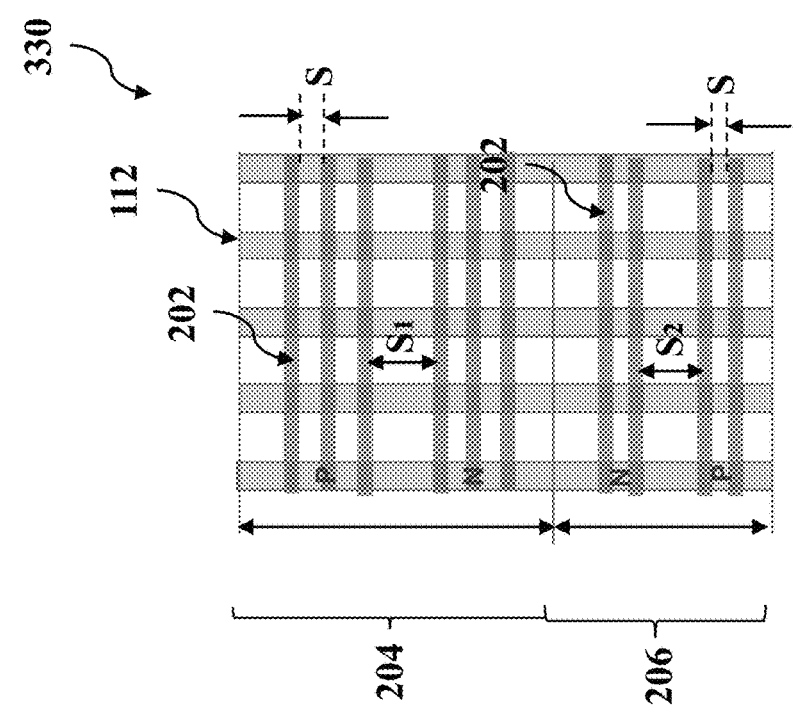

FIG. 13 is a top view of an IC structure 330 constructed according to one embodiment. The IC structure 330 is similar to the IC structure 200. The active regions have a NW structure. The standard cells include a large standard cell 204 and small standard cells 206 placed edge to edge. However, the active regions in the large standard cell 204 includes a first set of active regions having three active regions 202 spaced from each other with a spacing S and a second fin set having three active regions 202 spaced from each other with the spacing S. The first and second sets of active regions in the large standard cell 204 are spaced away with a spacing $S_1$. The active regions 202 in the small standard cell 206 includes a third set of active regions having two active regions 202 spaced from each other with the spacing S and a fourth set having two active regions 202 spaced from each other with the spacing S. The third and fourth sets are spaced away with a second spacing $S_2$. $S_1=S_2$ and $S_1$ is substantially greater than S, such as $S_1/S>2$.

Figure 14:
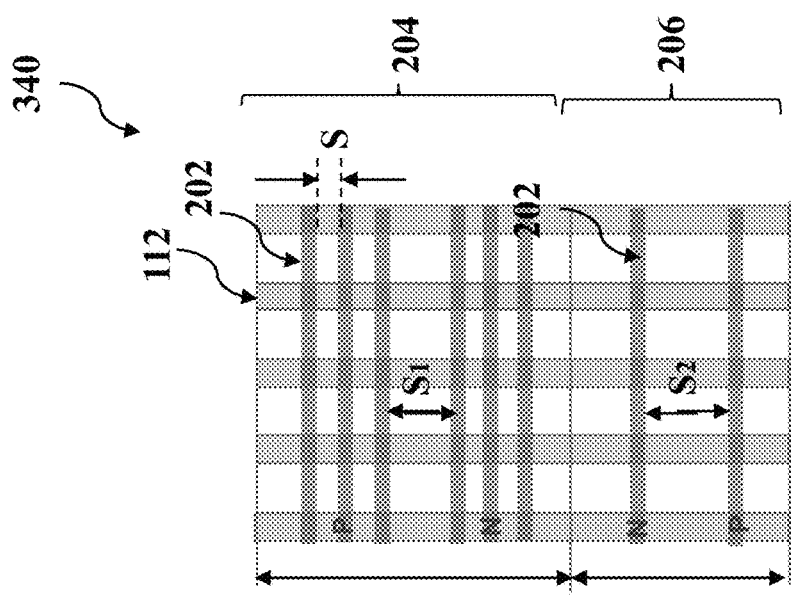

FIG. 14 is a top view of an IC structure 340 constructed according to one embodiment. The IC structure 330 is similar to the IC structure 200. The active regions have a NW structure. The standard cells include a large cell and small cells placed edge to edge. However, the active regions in the large cell includes a first fin set having three fin active regions 202 spaced from each other with a spacing $S_1$ and a second fin set having three fin active regions 202 spaced from each other with the first spacing $S_1$. The first and second sets are spaced away with a second spacing $S_2$. The active regions in the small cell includes a third fin set only having one fin active region 202 and a fourth fin set only having one fin active region 202. The third and fourth sets are spaced away with a second spacing $S_2$. $S_2$ is substantially greater than $S_1$, such as $S_2/S_1>2$.

FIG. 15 is a top view of an IC structure 350 having multiple standard cells placed in series edge by edge constructed according to one embodiment. The standard cells include large standard cells, such as 120, and small standard cells, such as 122. Particularly, the large standard cells 120 and small standard cells 122 are alternatively placed. Large standard cells 120 and small standard cells are categorized according to respective heights $D_l$ and $D_s$. Those large cells and small cells may have different lengths to provide flexibility to suit various devices and to be effectively stitched together. In the present embodiment, a large cell has a cell height $D_l=5*P\sim10*P$ and the small cell has a cell height $D_s=3*P\sim8*P$ and, in which P is the pitch of the fin active regions. In one example where P=30 nm, $D_l$ ranges between 150 nm and 300 nm, and $D_s$ ranges between 90 nm and 240 nm. Those cells may all be standard cells, or alternatively a subset thereof are standard cells.

Each cell includes various devices, such as nFETs and pFETs, according the given circuit. In the present embodiment, the vertically stacked channels are formed in the active regions with gates surrounding each channel of the vertically stacked channels. Further illustrated in FIG. 15 are various features of those devices, such as active regions 106 and 108, n-type doped wells 110, p-type doped wells 111, gates 112, source contacts 352 and drain contacts 353 landing on respective source and drain features, and source/ drain vias 354 landing on respective source contacts and drain contacts. The IC structure 350 further includes other circuit components, such as power rails 356 and signal tracks 358, which are conductive features coupled to devices for power and signal. In some embodiments, the power rails 356 and signal tracks 358 are both formed in the interconnect structure, such as formed as metal lines in the first metal layer of the interconnect structure. In some examples, the power rails 356 are connected to source contacts 352 and the signal tracks 358 are connected to the drain contacts 353, such as through respective source/drain vias 354.

Figure 16:
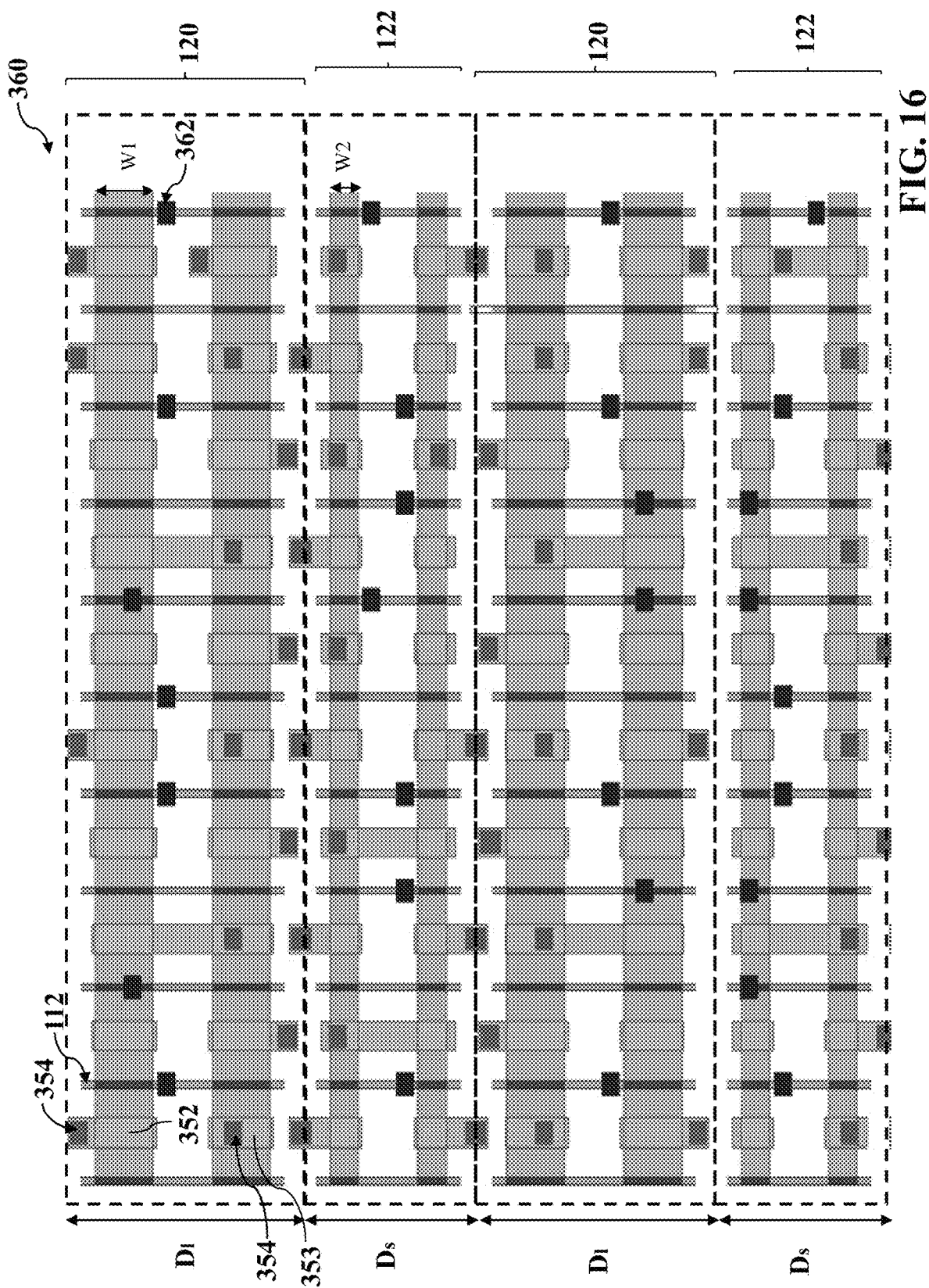

FIG. 16 is a top view of an IC structure 360 having multiple standard cells placed in series edge by edge constructed according to one embodiment. The standard cells include large standard cells, such as 120, and small standard cells, such as 122. Particularly, the large cells 120 and small cells 122 are alternatively placed. Other features, such as sources, drains, source contacts 352, drain contacts 353, source/drain vias 354, gate stacks 112, and gate contacts 362 are further illustrated in FIG. 16.

Figure 17:
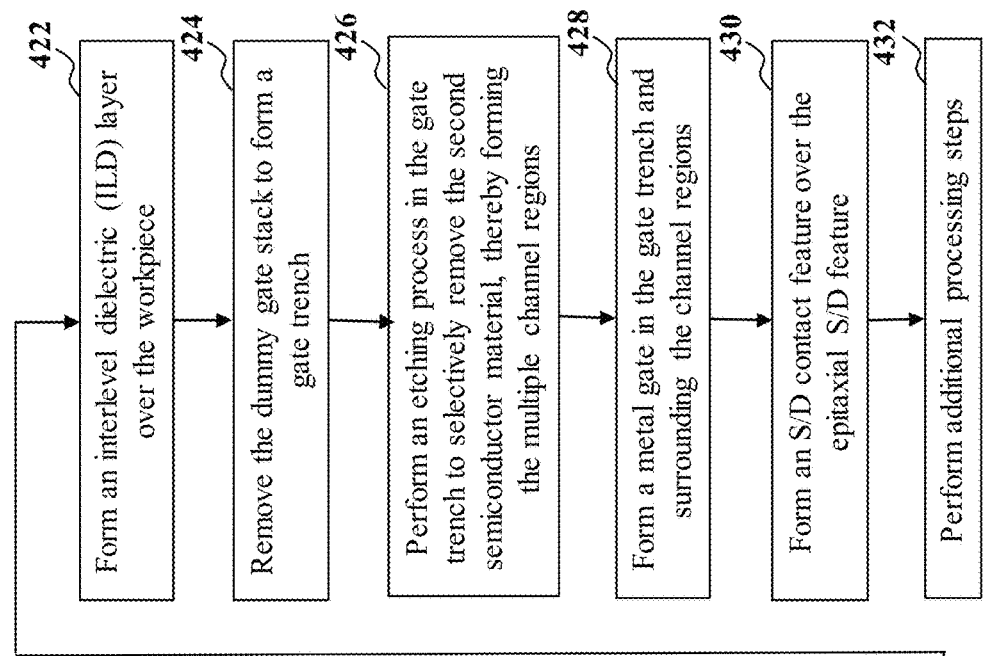
FIG. 17 is a flowchart of a method making an IC structure, constructed according to some embodiments.

FIG. 17 is a flowchart of a method 400 making an IC structure, such as 100, 200, and etc., constructed in accordance with some embodiments. Various operations are described in description of the IC structure 100 in FIGS. 1A-1D and 200 in FIGS. 2A-2C. Especially, after various operations of the method 400, multiple channels are formed on each active region, stacked vertically, and surrounded by the gates. The method 400 includes an operation 401 by providing a workpiece (such as 100 or 200 previously described) having a semiconductor substrate 102 with alternatively stacked semiconductor material layers. For example, a pair of silicon layers and silicon germanium layers are alternatively stacked by a suitable technique, such as epitaxial growth.

The method 400 includes an operation 402 to form various doped features including do wells (such as n-type doped wells 110, p-type doped wells 111, n-type doped channels and p-type doped channels 130) using suitable technique, such as ion implantation or in-site doping during the epitaxial growth to form the respective semiconductor layer.

The method 400 also includes an operation 404 to form isolation features 104 (such as shallow trench isolation features or STI features) to define the active regions. The formation of the isolation features may include: patterning the alternatively stacked semiconductor material layers using lithography process and etching to form trenches; filling the trenches with one or more dielectric material (such as silicon oxide, silicon nitride, low-k dielectric material or a combination thereof); and performing a CMP process.

The method 400 includes an operation 406 to form fin active regions, such as WNS 106 and NNS 108. The operation 406 may include etching to recess the isolation features 104 such that the fin active regions are extruded above the isolation features 104.

The method 400 includes an operation 408 to form dummy gate stacks by a procedure that includes deposition and patterning (that further includes lithography process and etching). The operation 408 also includes forming gate spacers 116 on the sidewalls of the dummy gate stacks by deposition and anisotropic etching. The operation 408 may additionally include forming dielectric gates 114 during the formation of the dummy gate stacks or during the gate replacement at later stages.

The method 400 includes an operation 410 to form sources and drains (or source/drain features) 126 by a procedure that includes etching to recess the source/drain regions and epitaxial growth to form the source/drain features 126 with proper semiconductor materials for device performance, such as strain effect.

The method 400 includes an operation 422 to form an interlevel dielectric (ILD) layer on the workpiece using a procedure that may include deposition and CMP. The method 400 includes an operation 424 to remove the dummy gate stacks to form the gate trenches using selective etching. The method 400 includes an operation 426 to perform an etching process in the gate trenches to selectively remove one of the first and second semiconductor material layers stacked in pair, such as selectively removing the second semiconductor material layers (e.g., silicon germanium), thereby forming the multiple channels (or channel regions) 130.

The method 400 includes an operation 428 to form metal gates 112 in the gate trenches such that the metal gates 112 surround the channels 130. The operation 428 may include deposition and CMP. The operations 424~428 are referred to as gate replacement. The method 400 may further include other operations, such as an operation 430 to form source/drain contact features, and an operation 432 to form other features, such gate contacts, vias and metal lines in an interconnect structure.

In various embodiments described above, the gates 112 are further described. The gate 112 includes a gate dielectric layer (such as silicon oxide) and a gate electrode (such as doped polysilicon) disposed on the gate dielectric layer.

In some embodiments, the gate 112 alternatively or additionally includes other proper materials for circuit performance and manufacturing integration. For example, the gate dielectric layer includes an interfacial layer (such as silicon oxide) and a high k dielectric material layer. The high k dielectric material may include metal oxide, metal nitride or metal oxynitride. In various examples, the high k dielectric material layer includes metal oxide: $ZrO_2$, $Al_2O_3$, and $HfO_2$, formed by a suitable method, such as metal organic chemical vapor deposition (MOCVD), physical vapor deposition (PVD), atomic layer deposition (ALD), or molecular beam epitaxy (MBE). In some examples, the interfacial layer includes silicon oxide formed by ALD, thermal oxidation or ultraviolet-Ozone Oxidation. The gate electrode includes metal, such as aluminum, copper, tungsten, metal silicide, doped polysilicon, other proper conductive material or a combination thereof. The gate electrode may include multiple conductive films designed such as a capping layer, a work function metal layer, a blocking layer and a filling metal layer (such as aluminum or tungsten). The multiple conductive films are designed for work function matching to n-type FET (nFET) and p-type FET (pFET), respectively. In some embodiments, the gate electrode for nFET includes a work function metal with a composition designed with a work function equal 4.2 eV or less and the gate electrode for pFET includes a work function metal with a composition designed with a work function equal 5.2 eV or greater. For examples, the work function metal layer for nFET includes tantalum, titanium aluminum, titanium aluminum nitride or a combination thereof. In other examples, the work function metal layer for pFET includes titanium nitride, tantalum nitride or a combination thereof.

Figure 18:
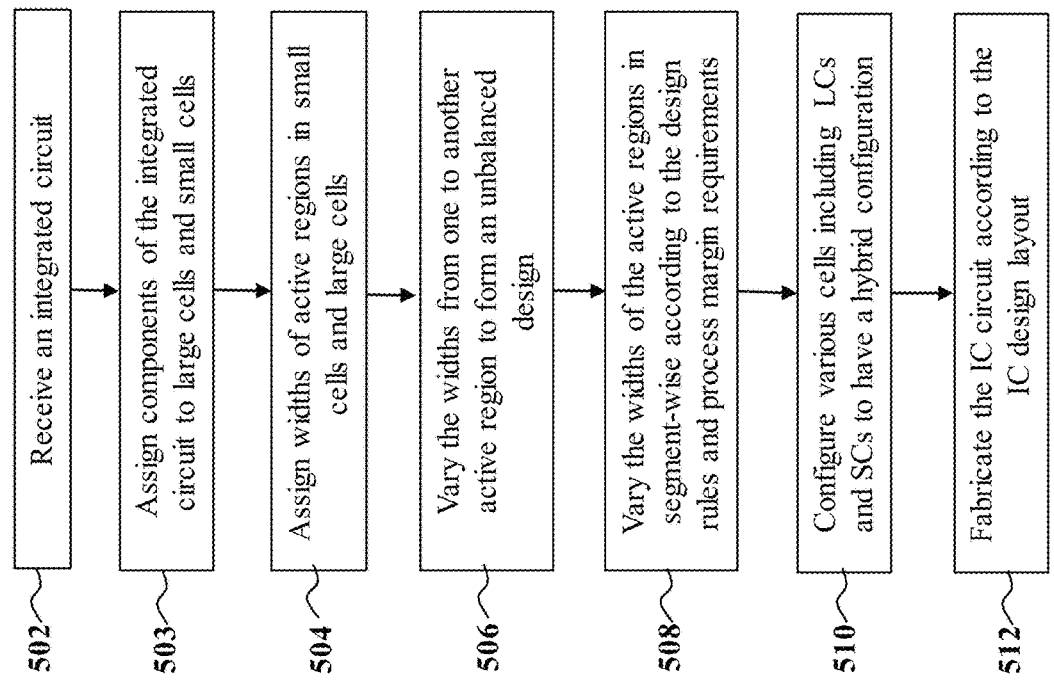
FIG. 18 is a flowchart of a method forming a design layout for an IC structure, constructed according to some embodiments.

FIG. 18 is a flowchart of a method 500 forming an IC design layout for an IC structure (such as 100 or 200) according to various embodiments. The method 500 and method 400 may be collectively used to form an IC design layout and fabricate an IC structure according to the IC design layout. The method 500 is described with further reference to FIG. 1A through FIG. 16.

The method 500 begins with a block 502 by receiving an integrated circuit (IC) and proceeds to following operations to form an IC design layout according to the integrated circuit. The integrated circuit includes one or more functional circuit including field-effect transistors and other devices. However, the functional circuit is a network that defines how those devices are connected but not define where each device is placed, positioned and spaced. Those will be further defined in the IC design layout. The IC design layout is formed further according to standard cells from a standard circuit library that includes plurality of standard cells, which can be repeated used in forming the IC design layout. The method 500 includes various operations on how to form standard cells and how standard cells are configured for enhanced circuit performance, circuit packing density and fabrication capability. As illustrated in various embodiments described above, the disclosed method 500 uses hybrid standard cells with different sizes. Especially, active regions are properly designed with various dimensional parameters. Various FETs are formed on those active regions with stacked channels including WNS, NNS and NW. The dimensional parameters include width W, spacing S and pitch P of those active regions. The dimensional parameters are defined and illustrated through various above embodiments. Those dimensional parameters are not independent but are related with each other. In some examples, P=W+S. Furthermore, the width W is associated with device (or circuit) performance, the spacing S is associated with process capability, and the pitch P is associated with circuit packing density. When the width W is increased, the device performance is improved but the pitch P may be increased, which will reduce the circuit packing density. When the spacing S is increased, the process capability is enhanced, which means that it can be fabricated with more processing margins, less fabrication challenges and high fabrication yield. However, the pitch P may be increased as well and the circuit packing density is also reduced. When the pitch P is reduced, the circuit packing density is increased but the width W and the spacing S may be reduced with reduced device performance and process capability. Therefore, there is no straightforward approach to form an IC design layout without sacrificing circuit performance, process capability and circuit packing density. The disclosed method 500 provides a procedure to form an IC design layout with circuit performance, process capability and circuit packing density all enhanced.

The method 500 may include an operation 503 to assign various portions or components of the integrated circuit into a large cell (LC) or a small cell (SC) according to various design rules, process capability, packing density and circuit performance. For example, if some devices require high device performance or process capability, those devices may be assigned to one or more LC.

The method 500 proceeds to an operation 504 to assign respective widths for large cells (LCs) and small cells (SCs). Particularly, the width $W_l$ of the LCs and the $W_s$ of the SCs are assigned differently such that $W_l$ is greater than $W_s$. This can be achieved in different ways. In one embodiment, the active regions of the LCs are assigned with WNSs and the active regions of the SCs are assigned with NNSs, such as the IC structure of FIG. 1A. In another embodiment, the active regions of LCs and SCs are both assigned NWs. However, each active region in a LC is replaced with a first number $N_l$ of NWs as $N_l$*NW and each active region in a SC is replaced with a second number $N_s$ of NWs as $N_s$*NW, in which $N_l$ and $N_s$ are both integers, and $N_l$ is greater than $N_s$. This increases the width of the active regions in the LCs compared the active regions in the SCs. In various examples, $N_l$ is 2 and $N_s$ is 1, such as in the IC structure of FIG. 2A; or $N_l$ is 3 and $N_s$ is 2, such as in the IC structure of FIG. 13; or $N_l$ is 3 and $N_s$ is 1, such as in the IC structure of FIG. 14. In the operation 504, after the widths are assigned, the spacing is kept the same for both LCs and SCs so that the pitch P for the LCs is slightly increased to fit to the size of the LCs.

Such defined widths of the active regions are further changed and fine-tuned to further enhance the device performance, process capability and circuit packing density. The method 500 includes an operation 506 to vary the width of the active regions such that the width of the active regions in a LC (or a SC) is varying from active region to another active region in the LC, thereby forming an IC design layout having an unbalanced structure, such as the IC structure in FIGS. 7 and 8. The operation 506 is similarly applied to all cells (LCs and SCs). In operation 506, the width of the active regions is varied from one active region to another active region. As one example illustrated in FIG. 7, the first stand cell 120 as a LC includes one active region 106 for pFETs with a first width $W_{p-l}$ and another active region for nFETs with a second width $W_{n-l}$ greater than the first width $W_{p-l}$. Similarly, the second stand cell 122 as a SC includes one active region 106 for pFETs with a third width $W_{p-s}$ and another active region for nFETs with a fourth width $W_{n-s}$ greater than the first width $W_{p-s}$. The operation 506 is applied according to circuit performance including power saving, matching for nFET and pFET, or other consideration to promote the overall circuit performance. In another example illustrated in FIG. 8, the first stand cell 120 as a LC includes one active region 106 for pFETs with a first width $W_{p-l}$ and another active region for nFETs with a second width $W_{n-l}$ less than the first width $W_{p-l}$. Similarly, the second stand cell 122 as a SC includes one active region 106 for pFETs with a third width $W_{p-s}$ and another active region for nFETs with a fourth width $W_{ns}$ less than the first width $W_{p-s}$ for similar consideration with different circuit specification.

The method 500 includes an operation 508 to further vary the width according to the design rules and the process margin requirements, therefore modifying the active regions with varying widths. The operation 508 is applied to vary the width of an active region from one segment to another segment, or in segment-wise. This is further described in detail according to some examples. In one example, if one active region either in a LC or a SC includes critical spot requiring more spacing, a segment of the active region associated with the critical spot is modified with reduced width so with an increased spacing. The operation 506 may apply each segment of an active region and each active region in the IC structure so that the active regions are segmented with varying widths in segment-wise. Such formed active regions have an L-shape, an U-shape (such as one in FIG. 11), a step-wise shape or other proper shapes, such as those illustrated in FIG. 5. In some examples, the width of an active region in one segment is even reduced to zero, therefore discrete or intermittent or broken active region with multiple segments aligned but not connected, as one illustrated in FIG. 6. Varying the width of an active region in segment-wise in the operation 508 may be applied according to other parameters, such as power reduction, device speed and process capability. In those consideration, the width may be varied to have a symmetric structure, such as those in a left portion 252 of the IC structure 250 in FIG.

5 and in a left portion 262 of the IC structure 260 in FIG. 6 according to in some embodiments, or the width may be varied to have an asymmetric structure, such as those in a right portion 254 of the IC structure 250 in FIG. 5 and in a right portion 264 of the IC structure 260 in FIG. 6 according to in some other embodiments.

The method 500 may also include an operation 510 to configure various standard cells including LCs and SCs to have a hybrid configuration. In the operation 510, the LCs and SCs are properly configured according to the overall circuit performance, the circuit packing density and other considerations. In some embodiments, the LCs and SCs are alternatively placed such that one SC is interposed between two LCs and one LC is interposed between two SCs, as those illustrated in FIGS. 15 and 16.

The method 500 may include other operations to further design standard cells and place standard cells to form an IC design layout for a given IC circuit. When the IC design layout is formed for the give an IC circuit using operations 504 through 510, an IC structure is fabricated according to the IC design layout in a block 512, which may include various steps in the method 400 of FIG. 17.

The present disclosure provides various embodiments of an IC structure having multiple standard cells configured according to the predefined rules. In various embodiments described above, standard cells are designed and placed according to the disclosed rules. In various embodiments described above, standard cells are designed and placed according to the disclosed rules. Two or more standard cells are placed in cascade with adjacent cells having different sizes ($D_s$ and $D_l$). Each standard cell includes one or more gates. The gates (and dielectric gates) in the cascaded standard cells are distributed evenly. In some embodiments, a large cell includes channels of nanosheet with a greater width while a small cell includes channels of nanosheet with a smaller width. In some embodiments, a large cell includes channels of nanowire having an intra-spacing and inter-spacing greater than the intra-spacing. Various advantages may present in various embodiments. By utilizing the disclosed layout having multiple standard cells, the IC structure, such as a logic circuit, has a high packing density, enhanced circuit performance and increased process window.

One aspect of the present disclosure involves an integrated circuit. The integrated circuit includes a first standard cell spanning a first dimension $D_l$ along a first direction from a first cell edge to a second cell edge, and spanning from a third cell edge to a fourth cell edge along a second direction being orthogonal to the first direction, wherein the first standard cell includes a first active region and a second active region spaced away with a first spacing therebetween along the first direction, and wherein each of the first and second active regions spans a first width $W_1$ along the first direction; a second standard cell spanning a second dimension $D_s$ along the first direction from a fifth cell edge to a sixth cell edge, and spanning from a seventh cell edge to an eighth cell edge along the second direction, wherein the second standard cell includes a third active region and a fourth active region spaced away with the first spacing therebetween along the first direction, wherein the second dimension $D_s$ is less than the first dimension $D_l$, each of the third and fourth active regions spans a second width $W_2$ along the first direction, wherein $W_2$ is less than the first width $W_1$, and the second standard cell is disposed such that the fifth cell edge is aligned with and contacts the second cell edge; and a plurality of gate stacks oriented along the first direction and continuously extend from the sixth cell edge of the second standard cell to the first cell edge of the first standard cell, wherein the first and second active regions have a structure different from a structure of the third and fourth active regions.

Another aspect of the present disclosure involves an integrated circuit that includes a first standard cell spanning a first dimension $L_1$ along a first direction from a first cell edge to a second cell edge and spanning a second dimension $L_2$ from a third cell edge to a fourth cell edge along a second direction being orthogonal to the first direction. The first standard cell includes a first active region and a second active region oriented along the second direction, and wherein the first active region and the second active region are spaced away with a first spacing S therebetween. The first standard cell includes a third active region and a fourth active region oriented along the second direction, and wherein the third active region and the fourth active region are spaced away with a second spacing $S_2$ therebetween, wherein the first and second active regions are spaced away from the third and fourth active regions with a third spacing $S_3$, wherein $S_1$ is equal to $S_2$, and wherein $S_3$ is greater than $S_1$. The integrated circuit includes a second standard cell spanning a third dimension $L_3$ along the first direction from a fifth cell edge to a sixth cell edge and spanning a fourth dimension $L_4$ from a seventh cell edge to an eighth cell edge along the second direction. The second standard cell includes a fifth active region and a sixth active region spanning from the seventh cell edge to the eighth cell edge along the second direction, wherein the fifth active region and the sixth active region are spaced away with a fourth spacing $S_4$ therebetween, wherein $S_4$ is equal to $S_3$, wherein $L_3$ is less than $L_1$ and $L_4$ is equal to $L_2$, and wherein the second standard cell is disposed such that the fifth cell edge is aligned with and contacts the second cell edge. The integrated circuit further includes a plurality of gate stacks oriented along the first direction and continuously extend from the sixth cell edge of the second standard cell to the first cell edge of the first standard cell, wherein the first, second, third, fourth, fifth, and sixth active regions have a same width W spanning along the first direction, wherein each of the first, second, third, fourth, fifth, and sixth active regions includes multiple channels vertically stacked, and wherein each of the multiple channels has a same thickness T, T being substantially equal to W.

Another aspect of the present disclosure involves an integrated circuit that includes a first standard cell spanning a first dimension along a first direction from a first cell edge to a second cell edge, and spanning from a third cell edge to a fourth cell edge along a second direction being orthogonal to the first direction, wherein the first standard cell includes a first active region and a second active region spaced away with a first spacing therebetween, and wherein the first and second active regions include a width varying along the second direction; a second standard cell spanning a second dimension along the first direction from a fifth cell edge to a sixth cell edge, region spanning from a seventh cell edge to an eighth cell edge along the second direction, wherein the second standard cell includes a third active region and a fourth active spaced away with the first spacing therebetween, wherein the second spacing is equal to the first spacing, the second dimension is less than the first dimension, the second standard cell is disposed such that the fifth cell edge is aligned with and contacts the second cell edge, and the third and fourth active regions include a constant width; and a plurality of gate stacks oriented along the first direction and continuously extend from the sixth cell edge of the second standard cell to the first cell edge of the first standard cell, wherein the first and second active regions have a structure different from a structure of the third and fourth active regions.

Yet another aspect of the present disclosure involves a method for forming an integrated circuit layout. The method includes receiving an integrated circuit; assigning components of the integrated circuit to large cells and small cells; assigning widths of active regions in small cells and large cells; varying the widths from one to another active region to form an unbalanced design; varying the widths of the active regions in segment-wise according to design rules and process margin requirements; and configuring various cells including LCs and SCs to have a hybrid configuration.

The foregoing has outlined features of several embodiments. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions and alterations herein without departing from the spirit and scope of the present disclosure.

What is claimed is:

1. An integrated circuit, comprising:
a first standard cell spanning a first dimension $D_L$ along a first direction from a first cell edge to a second cell edge, and spanning from a third cell edge to a fourth cell edge along a second direction being orthogonal to the first direction, wherein the first standard cell includes a first, second, third and fourth active regions longitudinally oriented in the second direction, and wherein the first and second active regions are spaced away from the third and fourth active regions with a first spacing $S_1$ along the first direction;
a second standard cell spanning a second dimension $D_S$ along the first direction from a fifth cell edge to a sixth cell edge, and spanning from a seventh cell edge to an eighth cell edge along the second direction, wherein the second standard cell includes a fifth and sixth active regions longitudinally oriented in the first direction and spaced away with the first spacing $S_1$ therebetween along the first direction, wherein the second dimension $D_S$ is less than the first dimension $D_L$; and
a plurality of gate stacks oriented along the first direction and continuously extend from the sixth cell edge of the second standard cell to the first cell edge of the first standard cell, wherein
each of the first, second, third and fourth active regions includes a plurality of segments aligned and spaced away from each other along the second direction; and
the fifth and sixth active regions continuously extend from the seventh cell edge to the eighth cell edge along the second direction.

2. The integrated circuit of claim 1, wherein
the first active region and the second active region are spaced away with a second spacing $S_2$ therebetween along the first direction;
the third active region and the fourth active region are spaced away with a third spacing $S_3$ therebetween along the first direction, wherein $S_2$ is equal to $S_3$, and wherein $S_1$ is greater than $S_2$; and
the fifth active region and the sixth active region are spaced away with a fourth spacing $S_4$ therebetween, wherein $S_4$ is equal to $S_1$.

3. The integrated circuit of claim 1, wherein
the first standard cell spans a third dimension $L_L$ from the third cell edge to the fourth cell edge along the second direction; and
the second standard cell spans a fourth dimension $L_S$ from the seventh cell edge to the eighth cell edge along the second direction, wherein $L_L$ is equal to $L_S$, and wherein the fifth cell edge contacts the second cell edge.

4. The integrated circuit of claim 1, wherein the second standard cell is disposed such that the third cell edge is aligned with the seventh cell edge and the fourth cell edge is aligned with the eighth cell edge.

5. The integrated circuit of claim 1, wherein the first, second, third, fourth, fifth, and sixth active regions have a same width W spanning along the first direction.

6. The integrated circuit of claim 1, wherein
each of the first, second, third, fourth, fifth, and sixth active regions includes multiple channels vertically stacked, and wherein each of the multiple channels has a same thickness T, T being substantially equal to W; and
each of the gate stacks laterally extends over the each of the first, second, third, fourth, fifth and sixth active regions and vertically extends down to surround each of the channels.

7. The integrated circuit of claim 1, further comprising:
a first p-type field-effect transistor (pFET) device formed on the first and second active regions;
a second pFET device formed on the sixth active region;
a first n-type field-effect transistor (nFET) device formed on the third and fourth active regions; and
a second nFET device formed on the fifth active region.

8. The integrated circuit of claim 1, wherein the plurality of gate stacks includes
a first gate stack aligned with and extending on the third and seventh cell edges; and
a second gate stack aligned with and extending on the fourth and eighth cell edges.

9. An integrated circuit, comprising:
a first standard cell spanning a first dimension $L_1$ along a first direction from a first cell edge to a second cell edge and spanning a second dimension $L_2$ from a third cell edge to a fourth cell edge along a second direction being orthogonal to the first direction, wherein the first standard cell includes
a first active region and a second active region oriented along the second direction, and wherein the first active region and the second active region are spaced away with a first spacing $S_1$ therebetween, and
a third active region and a fourth active region oriented along the second direction, and wherein the third active region and the fourth active region are spaced away with a second spacing $S_2$ therebetween, wherein the first and second active regions are spaced away from the third and fourth active regions with a third spacing $S_3$, wherein $S_1$ is equal to $S_2$, and wherein $S_3$ is greater than $S_1$;
a second standard cell spanning a third dimension $L_3$ along the first direction from a fifth cell edge to a sixth cell edge and spanning a fourth dimension $L_4$ from a seventh cell edge to an eighth cell edge along the second direction, wherein the second standard cell includes a fifth active region and a sixth active region spanning from the seventh cell edge to the eighth cell edge along the second direction, wherein the fifth active region and the sixth active region are spaced away with a fourth spacing $S_4$ therebetween, wherein $S_4$ is equal to $S_3$, wherein $L_3$ is less than $L_1$ and $L_4$ is equal to $L_2$, and wherein the second standard cell is disposed such that the fifth cell edge is aligned with and contacts the second cell edge; and a plurality of gate stacks oriented along the first direction and continuously extend from the sixth cell edge of the second standard cell to the first cell edge of the first standard cell.

10. The integrated circuit of claim 9, wherein the first, second, third, fourth, fifth, and sixth active regions have a same width W spanning along the first direction; and the second standard cell is disposed such that the third cell edge is aligned with the seventh cell edge and the fourth cell edge is aligned with the eighth cell edge.

11. The integrated circuit of claim 10, wherein each of the first, second, third, fourth, fifth, and sixth active regions includes multiple channels vertically stacked, and wherein each of the multiple channels has a same thickness T, T being substantially equal to W.

12. The integrated circuit of claim 11, wherein each of the gate stacks laterally extends over the each of the first, second, third, fourth, fifth and sixth active regions and vertically extends down to surround each of the channels, wherein the each of the gate stacks includes a gate dielectric layer and a gate electrode.

13. The integrated circuit of claim 9, wherein each of the first and second active regions includes a plurality of segments aligned and spaced away from each other along the second direction;

each of the third and fourth active regions includes a plurality of segments aligned and spaced away from each other along the second direction; and the fifth and sixth active regions continuously extend from the seventh cell edge to the eighth cell edge along the second direction.

14. The integrated circuit of claim 13, further comprising:

a first p-type field-effect transistor (pFET) device formed on the first and second active regions;

a second pFET device formed on the sixth active region;

a first n-type field-effect transistor (nFET) device formed on the third and fourth active region; and a second nFET device formed on the fifth active region.

15. The integrated circuit of claim 9, wherein the plurality of gate stacks includes a first gate stack aligned with and extending on the third and seventh cell edges; and a second gate stack aligned with and extending on the fourth and eighth cell edges.

16. An integrated circuit, comprising:

a first standard cell spanning a first dimension along a first direction from a first cell edge to a second cell edge, and spanning from a third cell edge to a fourth cell edge along a second direction being orthogonal to the first direction, wherein the first standard cell includes a first active region and a second active region longitudinally oriented in the second direction and spaced away with a first spacing therebetween, and wherein the first and second active regions each include a width varying along the second direction;

a second standard cell spanning a second dimension along the first direction from a fifth cell edge to a sixth cell edge, and spanning from a seventh cell edge to an eighth cell edge along the second direction, wherein the second standard cell includes a third active region and a fourth active region longitudinally oriented in the second direction and spaced away, wherein the second dimension is less than the first dimension, and the third and fourth active regions each include a constant width; and a plurality of gate stacks longitudinally oriented along the first direction and continuously extend from the sixth cell edge of the second standard cell to the first cell edge of the first standard cell.

17. The integrated circuit of claim 16, wherein the second standard cell is disposed such that the third cell edge is aligned with the seventh cell edge and the fourth cell edge is aligned with the eighth cell edge.

18. The integrated circuit of claim 16, wherein each of the first, second, third and fourth active regions includes a plurality of channels vertically stacked; and each of the gate stacks laterally extends over the each of the first, second, third and fourth active regions and vertically extends to surround each of the channels.

19. The integrated circuit of claim 18, wherein the channels in the first and second active regions include a first width $W_1$ and a first thickness $T_1$; and the channels in the third and fourth active regions include a second width $W_2$ and a thickness $T_2$, $W_1$ being substantially greater than $W_2$, and $T_1$ and $T_2$ being substantially equal.

20. The integrated circuit of claim 19, further includes a first p-type field-effect transistor (pFET) device formed on the first active region;

a second pFET device formed on the fourth active region;

a first n-type field-effect transistor (nFET) device formed on the second active region; and a second nFET device formed on the third active region.

* * * * *